US011239181B2

(12) United States Patent
Kothari et al.

(10) Patent No.: US 11,239,181 B2
(45) Date of Patent: Feb. 1, 2022

(54) INTEGRATED ASSEMBLIES

(71) Applicant: Micron Technology, Inc., Boise, ID (US)

(72) Inventors: Rohit Kothari, Boise, ID (US); Lifang Xu, Boise, ID (US); Jian Li, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/662,705

(22) Filed: Oct. 24, 2019

(65) Prior Publication Data

US 2021/0125939 A1 Apr. 29, 2021

(51) Int. Cl.
| | |
|---|---|
| *H01L 27/1157* | (2017.01) |
| *H01L 23/00* | (2006.01) |
| *H01L 23/522* | (2006.01) |
| *H01L 23/528* | (2006.01) |
| *H01L 27/11519* | (2017.01) |
| *H01L 27/11524* | (2017.01) |
| *H01L 27/11582* | (2017.01) |
| *H01L 27/11556* | (2017.01) |
| *H01L 27/11565* | (2017.01) |
| *H01L 27/11573* | (2017.01) |
| *H01L 27/11529* | (2017.01) |

(52) U.S. Cl.
CPC ........ *H01L 23/562* (2013.01); *H01L 23/5226* (2013.01); *H01L 23/5283* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
CPC ............... H01L 23/562; H01L 23/5226; H01L 23/5283; H01L 27/11519; H01L 27/11524; H01L 27/11529; H01L 27/11556; H01L 27/11565; H01L 27/1157; H01L 27/11573; H01L 27/11582
See application file for complete search history.

(56) References Cited

U.S. PATENT DOCUMENTS

| | | | | |
|---|---|---|---|---|
| 8,421,141 | B2 * | 4/2013 | Hsu | H01L 29/40114 257/315 |
| 2016/0276359 | A1 * | 9/2016 | Oginoe | H01L 27/11556 |
| 2020/0227555 | A1 * | 7/2020 | Sun | H01L 27/11556 |
| 2020/0251487 | A1 * | 8/2020 | Tang | H01L 27/11582 |

* cited by examiner

*Primary Examiner* — Mark W Tornow
(74) *Attorney, Agent, or Firm* — Wells St. John P.S.

(57) ABSTRACT

Some embodiments include an integrated assembly having a semiconductor die with memory array regions and one or more regions peripheral to the memory array regions. A stack of alternating insulative and conductive levels extends across the memory array regions and passes into at least one of the peripheral regions. The stack generates bending stresses on the die. At least one stress-moderating region extends through the stack and is configured to alleviate the bending stresses.

42 Claims, 20 Drawing Sheets

INTEGRATED ASSEMBLIES

TECHNICAL FIELD

Integrated assemblies, integrated memory, integrated die configurations.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells (memory structures).

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

The memory arrays (memory devices) may be fabricated on semiconductor dies. FIGS. 5-10 illustrate regions of an example integrated assembly 10 associated with a conventional die comprising conventional memory devices. The top-down view of FIG. 5 shows that the integrated assembly 10 includes a pair of memory device tiles (or tile regions) 12 and 14, with the tiles being spaced from one another by an inter-tile region 16.

The tile 12 comprises a first memory device sub-block (or block region) 18, and a second memory device sub-block (or block region) 20; with the sub-blocks 18 and 20 being spaced from one another by an intervening inter-block region 22.

The tile 12 also includes an interconnect region (e.g., staircase region) 24 for establishing connections to individual conductive levels of a wordline stack (discussed below). The illustrated interconnect region 24 includes a pair of spaced-apart trenches 26 and 28 for establishing connections to different sets of the conductive levels, and includes a region 30 between the spaced-apart trenches.

Additionally, the tile 12 includes memory array regions 32 and 34 within the sub-blocks 18 and 20, respectively; and includes an intervening region 36 between the interconnect region 24 and the memory array regions 32 and 34. Channel material pillars 38 are within the memory array regions 32 and 34, and pass through a stack of conductive levels (discussed below); and support structures 40 are within the intervening region 36, and also pass through the stack of conductive levels. Notably, the channel material pillars 38 are formed to higher density than the support structures 40. Specifically, there are more channel material pillars 38 per unit area than support structures 40 per unit area. The channel material pillars 38 are shown to be circular, while the support structures 40 are shown to be square. Such difference in the shapes of the channel material pillars relative to the support structures is utilized to emphasize that the support structures comprise a different configuration than the channel material pillars. It is to be understood that the channel material pillars and the support structures may comprise any suitable shapes, and may or may not be different shapes relative to one another.

A gap is provided between the intervening region 36 and the memory array regions 32 and 34 to indicate that there may be a distance between the memory array regions and the intervening region 36, and also to indicate that there may be additional components between the memory array region and the intervening region 36.

Routing regions 42 extend through the memory array regions 32 and 34. The routing regions may provide access for bitlines and/or other components.

The tile 14 comprises features analogous to those described above with reference to the tile 12. Specifically, the tile 14 comprises a first memory device sub-block (or block region) 48, and a second memory device sub-block (or block region) 50; with the sub-blocks 48 and 50 being spaced from one another by an intervening inter-block region 52. The tile 14 includes an interconnect region (e.g., staircase region) 54 having a pair of spaced-apart trenches 56 and 58, and includes a region 60 between the spaced-apart trenches. The tile 14 also includes memory array regions 62 and 64 within the sub-blocks 48 and 50, respectively; and includes an intervening region 66 between the interconnect region 54 and the memory array regions 62 and 64. The channel material pillars 38 are within the memory array regions 62 and 64, and the support structures 40 are within the intervening region 66. Routing regions 68 extend through the memory array regions 62 and 64, with such routing regions being analogous to the routing regions 42 discussed above.

A periphery (peripheral region) 70 is along sides of the tiles 12 and 14. The peripheral region is not shown along the intervening regions 36 and 66, or along the interconnect regions 24 and 54, but in some applications may extend along one or more of such regions.

The inter-tile region 16, and the inter-block regions 22 and 52, may be considered to comprise slits filled with insulative material 72. Such slits may extend along the sides of the tiles 12 and 14, as shown; so that the peripheral region 70 is offset from the sides of the tiles by the slits filled with the insulative material 72.

The memory array regions 32 and 34 may be considered to have first sides 35 adjacent the intervening region 36, and to have additional sides 37 and 39 adjacent the peripheral region 70. Similarly, the memory array regions 62 and 64 may be considered to comprise first sides 65 adjacent the intervening region 66, and to comprise second sides 67 and 69 adjacent the peripheral region 70.

FIGS. 6-10 show cross-sectional views along the lines A-A, B-B, C-C, D-D and E-E, respectively, of FIG. 5.

Referring to FIG. 6, the cross-sectional view A-A extends across the inter-block region 22, and across portions of the memory blocks 18 and 20. The illustrated region includes a stack 74 of alternating conductive levels 76 and insulative levels 78.

The conductive levels 76 comprise conductive material 80, and the insulative levels 78 comprise insulative material 82.

The conductive material 80 may comprise any suitable composition(s); and in some embodiments may comprise metal-containing material (e.g. tungsten). In some applications, the conductive material 80 may comprise a tungsten core at least partially surrounded by a liner comprising metal nitride (e.g., titanium nitride).

The insulative material 82 may comprise any suitable composition(s); and in some applications may comprise, consist essentially of, or consist of silicon dioxide.

The channel material pillars 38 extend through the stack 74, and comprise channel material 84. The channel material 84 may, for example, comprise, consist essentially of, or consist of appropriately-doped silicon. The channel material pillars 38 are shown to be annular rings surrounding insulative material 86. Such configuration of the channel material pillars may be considered to correspond to a "hollow" channel configuration, with the dielectric material 86 being provided within the hollows of the channel material pillars. In other applications, the channel material may be configured as solid pillars, rather than being configured as the illustrated hollow pillars.

The channel material pillars 38 are spaced from the conductive levels 76 of the stack 74 by intervening regions 88. The regions 88 may comprise tunneling material, charge-storage material, charge-blocking material and dielectric-barrier material. The tunneling material (also referred to as gate dielectric material) may comprise one or more of silicon dioxide, aluminum oxide, hafnium oxide, zirconium oxide, etc. The charge-storage material may comprise charge-trapping material (e.g., one or more of silicon nitride, silicon oxynitride, conductive nanodots, etc.). The charge-blocking material may comprise one or more of silicon dioxide, aluminum oxide, hafnium oxide, zirconium oxide, etc. The dielectric-barrier material may comprise one or more of aluminum oxide, hafnium oxide, zirconium oxide, etc.

Memory cells (e.g., NAND memory cells) 90 (only some of which are labeled) are along the channel material pillars 38. The memory cells 90 include regions of the conductive levels 76 (specifically, control gate regions), portions of the channel material 84, and portions of the tunneling material, charge-storage material, charge-blocking material and dielectric-barrier material within the intervening regions 88. The memory cells 90 are vertically-stacked one atop another.

In some embodiments, the assembly 10 may be considered to comprise a three-dimensional NAND configuration (three-dimensional memory device) analogous to the configuration described above with reference to FIG. 2.

The conductive levels 76 may be referred to as wordline/control gate levels, in that they include wordlines and control gates associated with the vertically-stacked memory cells 90 of NAND strings. The number of memory cell levels in individual strings may be determined by the number of conductive levels 76. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

One or more of the lower conductive levels 76 may be incorporated into source-side select gates (SGSs).

The stack 74 is shown to be supported over a source structure 92. Such source structure may be analogous to the source structures 216 discussed above.

The source structure 92 is supported by a semiconductor-base 15. The base 15 may comprise semiconductor material; and may, for example, comprise, consist essentially of, or consist of monocrystalline silicon. The base 15 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 15 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 15 and the source structure 92 to indicate that there may be other components, materials, etc., provided between the base 15 and the structure 92.

The base 15 may be considered to represent a portion of a semiconductor die; and an integrated-circuit-die may be considered to comprise the stack 74 together with the base 15.

Referring to FIG. 7, the cross-sectional view B-B extends across the intervening region 66, and across a pair of the support structures 40. The support structures 40 pass through the stack 74 of alternating levels 76 and 78. The conductive structure 92 is not shown in FIG. 7, but it is to be understood that the support structures 40 may pass through the stack 74 to an upper surface of such conductive structure.

The support structures 40 comprise a conductive material 94.

An insulative material 96 spaces the conductive material 94 from the levels 76 and 78 of the stack 74.

The conductive material 94 may comprise any suitable composition(s); such as, for example, one or more of tungsten, titanium nitride, tantalum nitride, etc.

The insulative material 96 may comprise any suitable composition(s); such as, for example, silicon dioxide.

The support structures may be "live" meaning that they are electrically coupled with active circuitry, or may be "dummy" meaning that they are not electrically coupled with active circuitry. In some applications, some of the support structures are live while others are dummy.

Referring to FIG. 8, the cross-sectional view C-C extends across the interconnect region (staircase region) 24. The first trench 26 enables connections 97 to be made from a first series of the conductive levels 76 to circuitry 98, and the second trench 28 enables connections 100 to made from a second series of the conductive levels 76 to the circuitry 98. In some embodiments, the circuitry 98 may be driver circuitry (e.g., wordline driver circuitry). The connections 100 may extend to the same driver circuitry 98 as the connections 97 (as shown), or may extend to different driver circuitry than the connections 97.

An insulative material 77 is over the interconnect region 24, and the trenches 26 and 28 extend into such insulative material. The insulative material 77 may comprise any suitable composition(s); and in some embodiments may comprise, consist essentially of, or consist of silicon dioxide.

Referring to FIG. 9, the cross-sectional view D-D extends across the peripheral region 70. The stack 74 passes into the peripheral region 70. The conductive structure 92 is not shown in FIG. 9. The conductive structure 92 may or may not be present within the illustrated portion of the peripheral region 70.

Referring to FIG. 10, the cross-sectional view D-D extends across one of the routing regions 42. The stack 74 is adjacent to the routing region 42. The conductive structure 92 is not shown in FIG. 10, but would generally be present along the cross-section of FIG. 10. Routing segments 102 are diagrammatically illustrated in FIG. 10, and pass through an insulative material 104. The routing segments 102 may be utilized for coupling to bitlines and/or other features associated with the memory arrays of FIG. 5 (e.g., the memory array 34). The routing segments comprise conductive material 106. Such conductive material may comprise any suitable conductive composition(s); including, for example, metal-containing material (e.g., tungsten, titanium nitride, tantalum nitride, copper, aluminum, etc.).

The insulative material 104 may comprise any suitable composition(s); such as, for example, silicon dioxide.

FIGS. 11 and 12 show portions of a prior art assembly 10a analogous to the assembly 10 of FIG. 5, but having a block 108 of the stack 74 within the inter-tile region 16. The conductive structure 92 is not shown in FIG. 12, but it is to be understood that such conductive structure may be under the illustrated region of the stack 74.

A problem encountered with the semiconductor dies of conventional assemblies (e.g., the assemblies 10 and 10a of FIGS. 5-12) is that such dies may bend, leading to breakage of components associated with the dies. It would be desirable to develop configurations which avoid such problematic bending.

DETAILED DESCRIPTION OF THE ILLUSTRATED EMBODIMENTS

Some embodiments include recognition that the die-bending problems described above in the Background section may result, at least in part, from stresses imposed by the conductive material within the above-discussed stacks 74 of alternating conductive levels and insulative levels. Specifically, the conventional die configurations described above in the Background section have a greater amount of conductive material per unit area (greater density of the conductive material) within regions distal from (distant from) the memory structures of the memory arrays than along the tightly-packed memory of the memory arrays due to the tightly-packed channel material pillars breaking up the conductive material along the tightly-packed memory. Some embodiments utilize stress-moderating regions to break up the conductive material within the regions distal from the tightly-packed memory to thereby balance stress across semiconductor dies and alleviate, or even prevent, the problematic die-bending problems. Example embodiments are described with reference to FIGS. 13-20.

Figure 1:
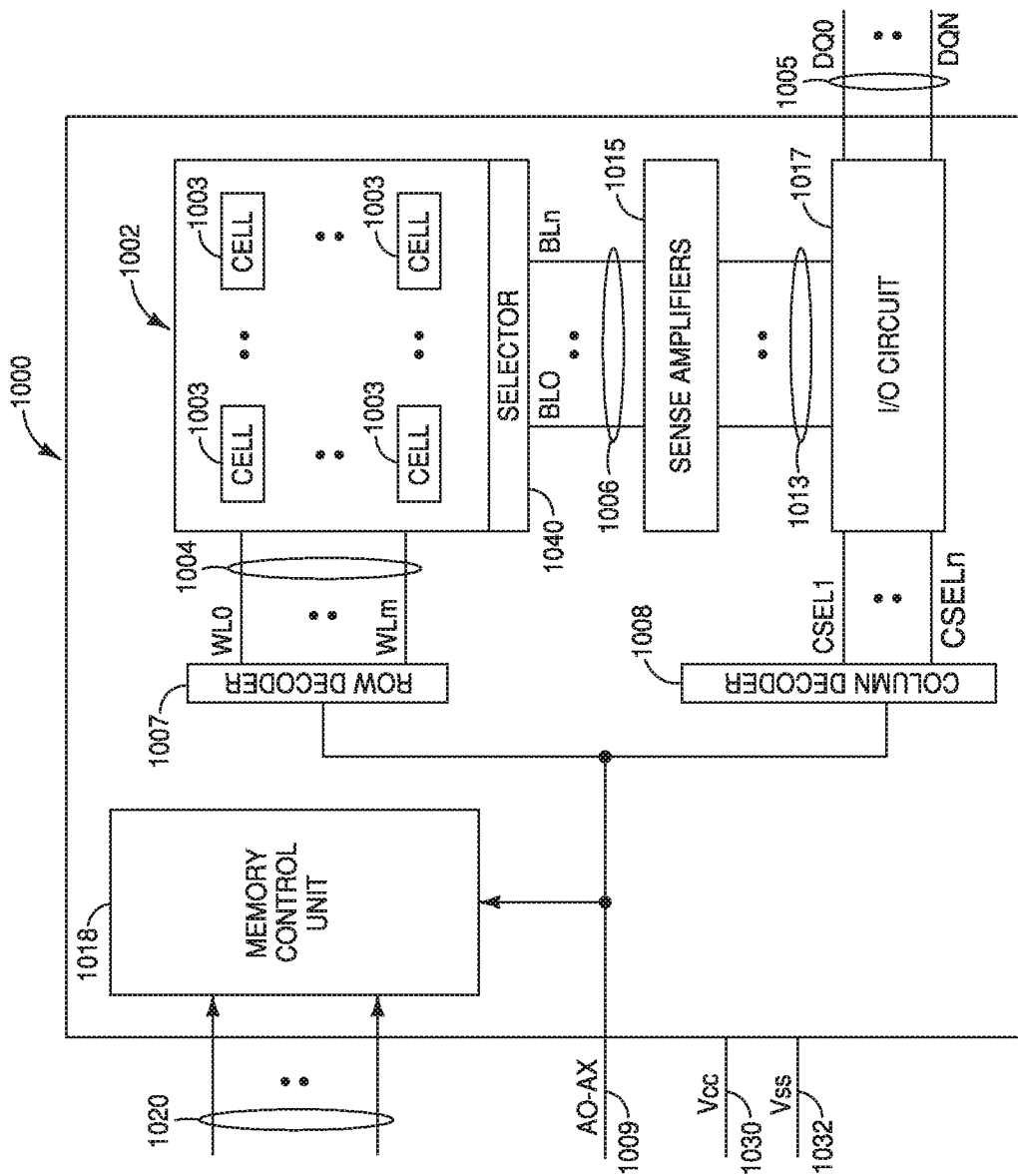
FIG. 1 shows a block diagram of a prior art memory device having a memory array with memory cells.
Figure 2:
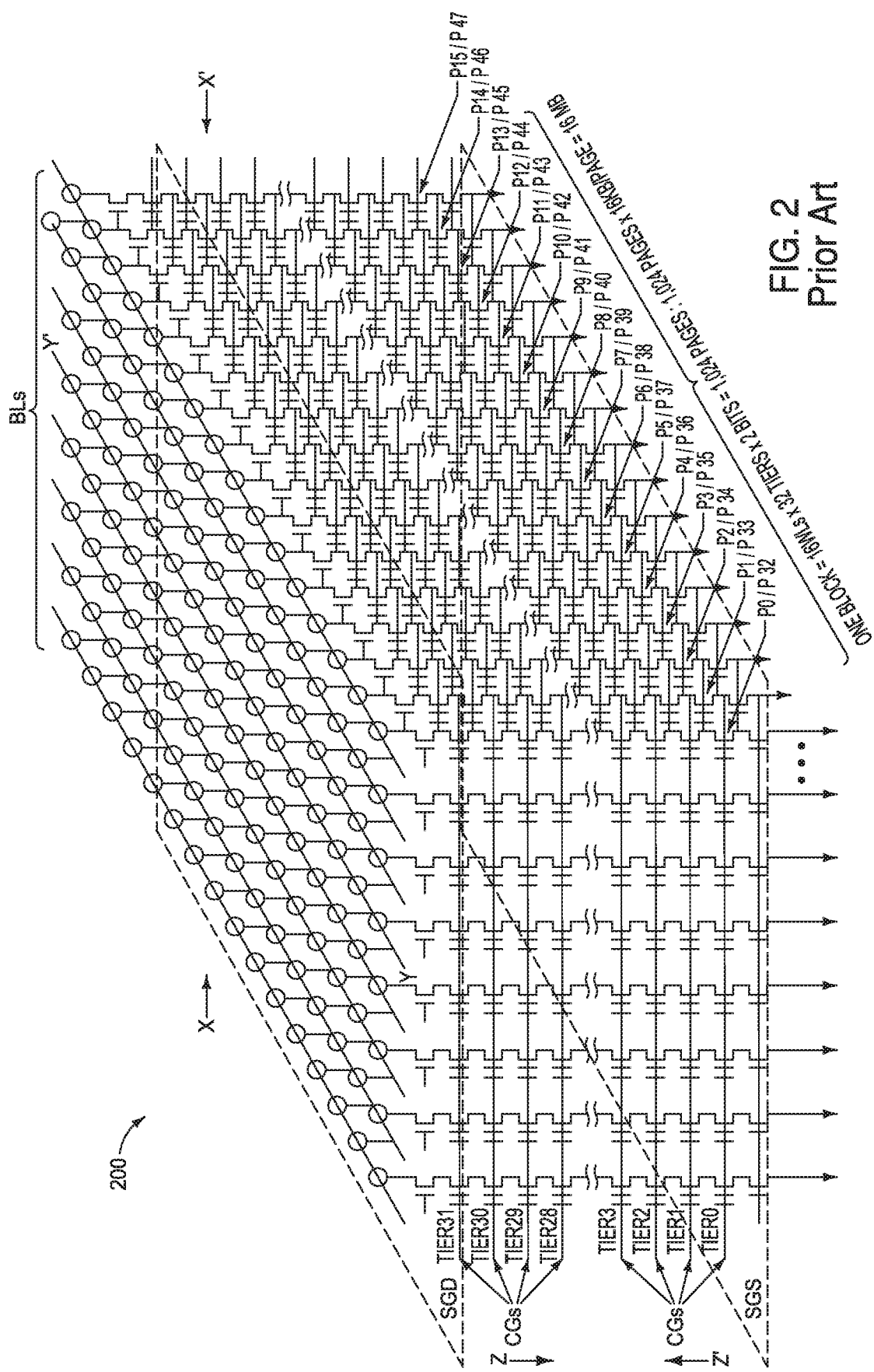
FIG. 2 shows a schematic diagram of the prior art memory device of FIG. 1 in the form of a 3D NAND memory device.
Figure 3:
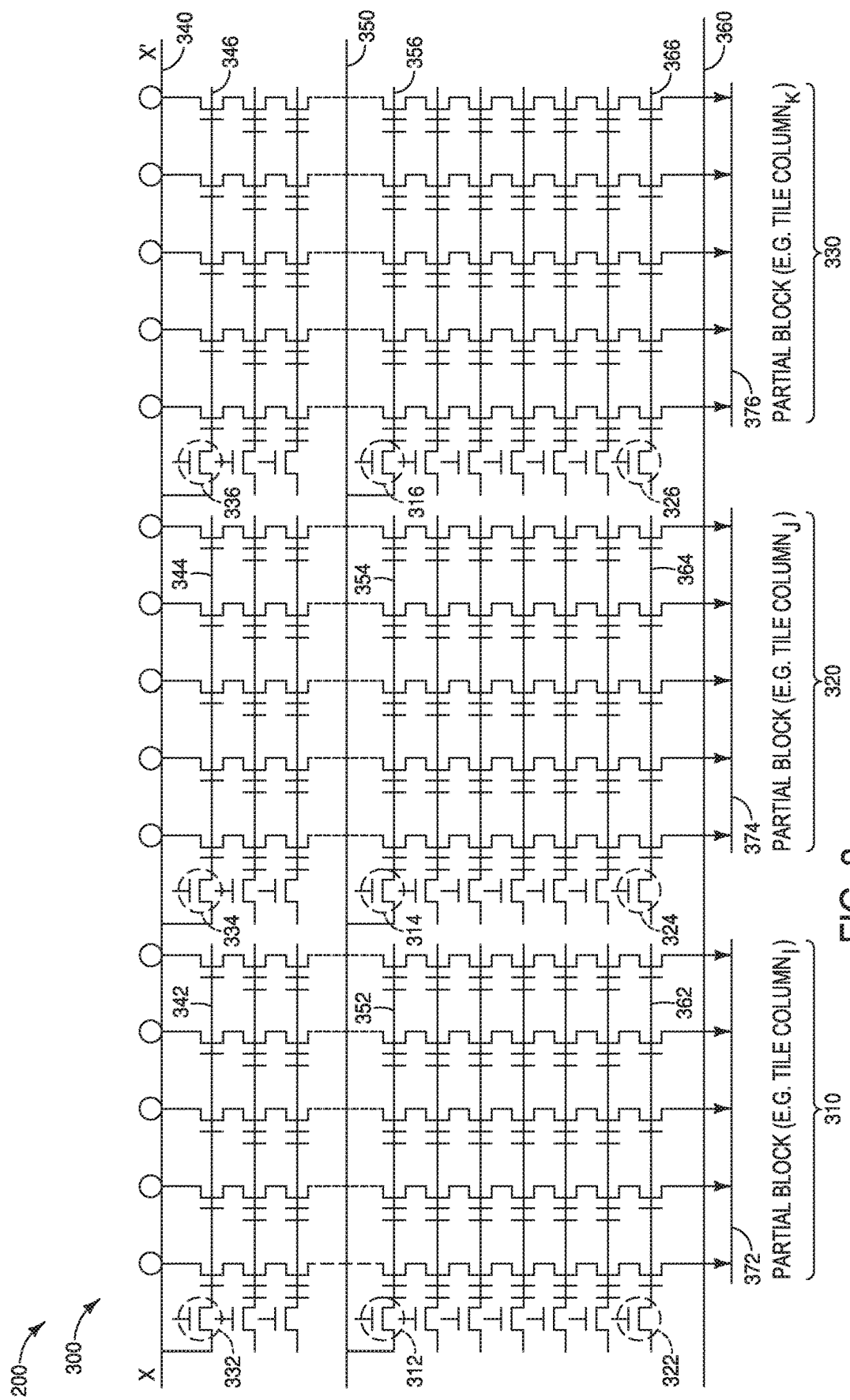
FIG. 3 shows a cross-sectional view of the prior art 3D NAND memory device of FIG. 2 in an X-X' direction.
Figure 4:
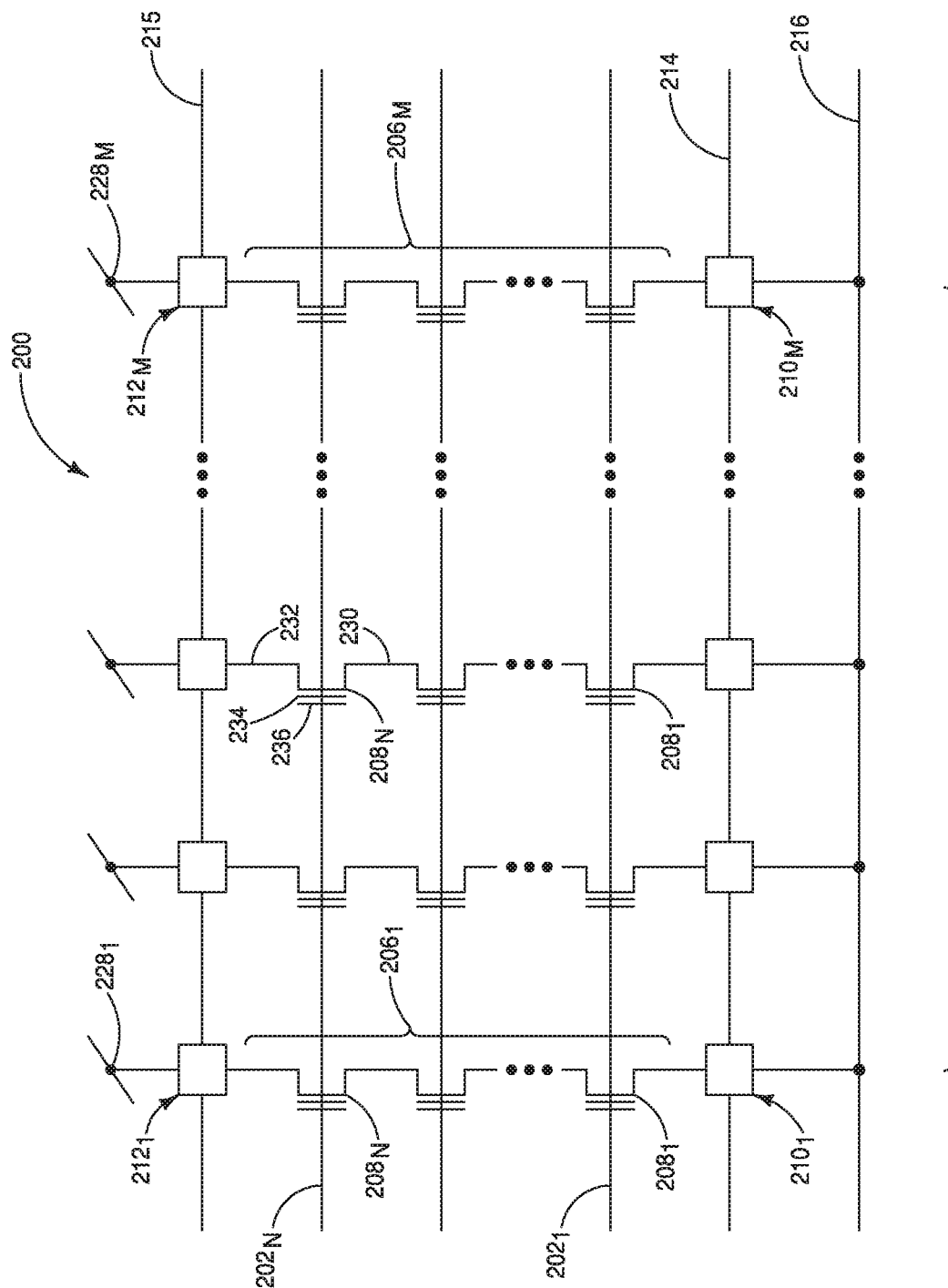
FIG. 4 is a schematic diagram of a prior art NAND memory array.
Figure 5:
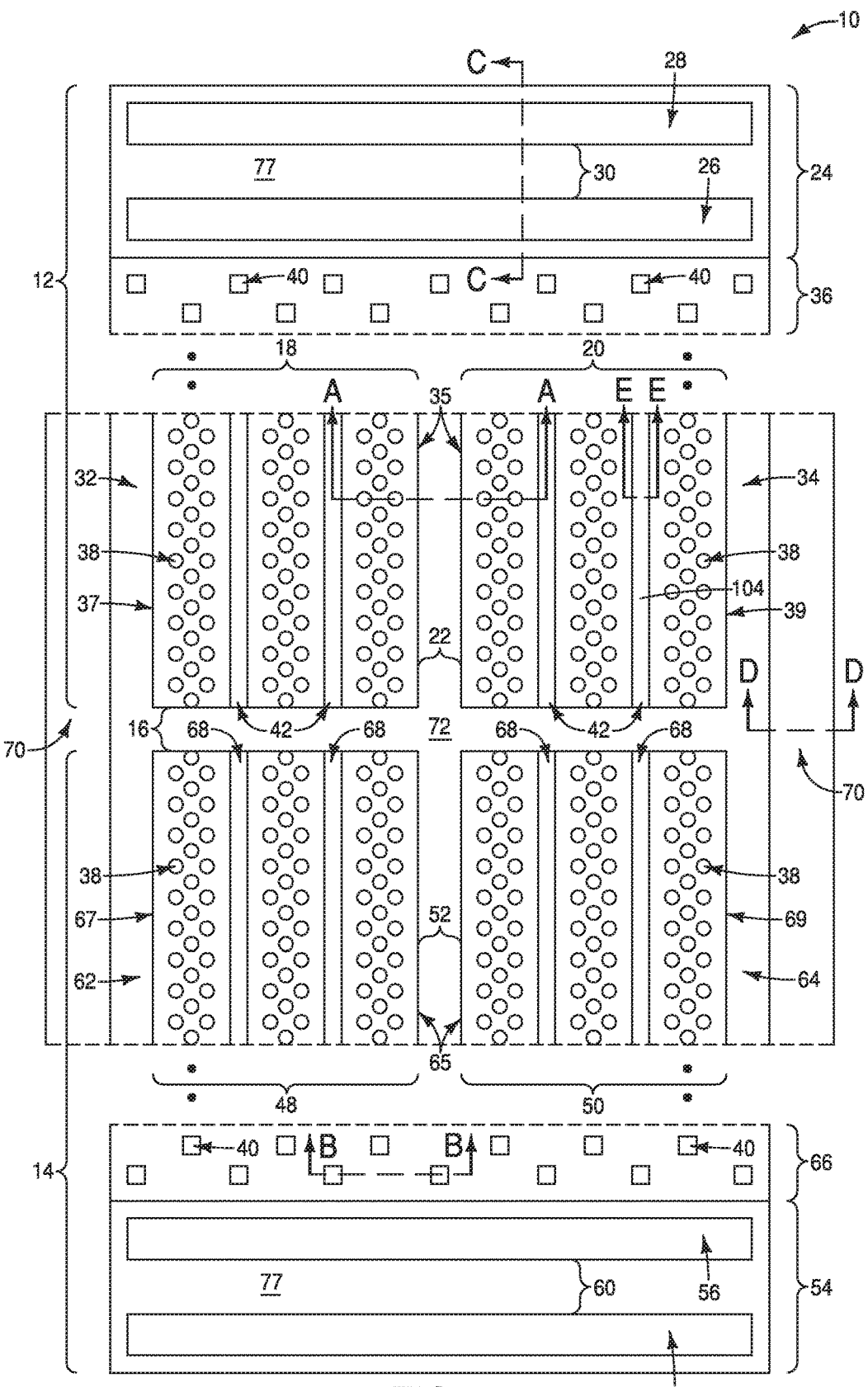
FIG. 5 is a diagrammatic top-down view of a prior art integrated assembly showing a pair of tiles associated with a semiconductor die.

Referring to FIGS. 13-18, an integrated assembly 10b is shown in a configuration analogous to that described above with reference to FIG. 5. The assembly 10b is similar to the assembly 10 of FIG. 5, but includes one or more stress-moderating regions. Potential locations for the stress-moderating regions are indicated with dashed-line boxes in the top-down view of FIG. 13. The stress-moderating regions extend through the stack 74 (or at least partially through the stack 74) to alleviate (and in some applications, even entirely prevent) the problematic die bending described above in the Background section. The stress-moderating regions may be alternatively referred to as stress-engineered regions, and may be formed in locations which are engineered to alleviate undesired stresses across an integrated-circuit-die. The stress-engineered regions may be formed to suitable sizes and shapes to alleviate undesired stresses across the integrated-circuit-die, and may be filled (or at least partially filled) with materials tailored to alleviate undesired stresses across the integrated-circuit-die.

In some embodiments, the integrated assembly 10b may be considered to comprise a memory array region (e.g., the region 32), and to comprise one or more regions peripheral to such memory array region (e.g., the regions 24, 36 and 70). The stack 74 (shown in, for example, FIG. 14) of the alternating conductive and insulative levels 76 and 78 extends across the memory array region, and passes into at least one of the regions peripheral to the memory array region. The stack may generate bending stresses on the die; with the "die" being understood to comprise the stack 74 and any supporting materials under such stack and associated with an integrated-circuit-assembly.

Figure 6:
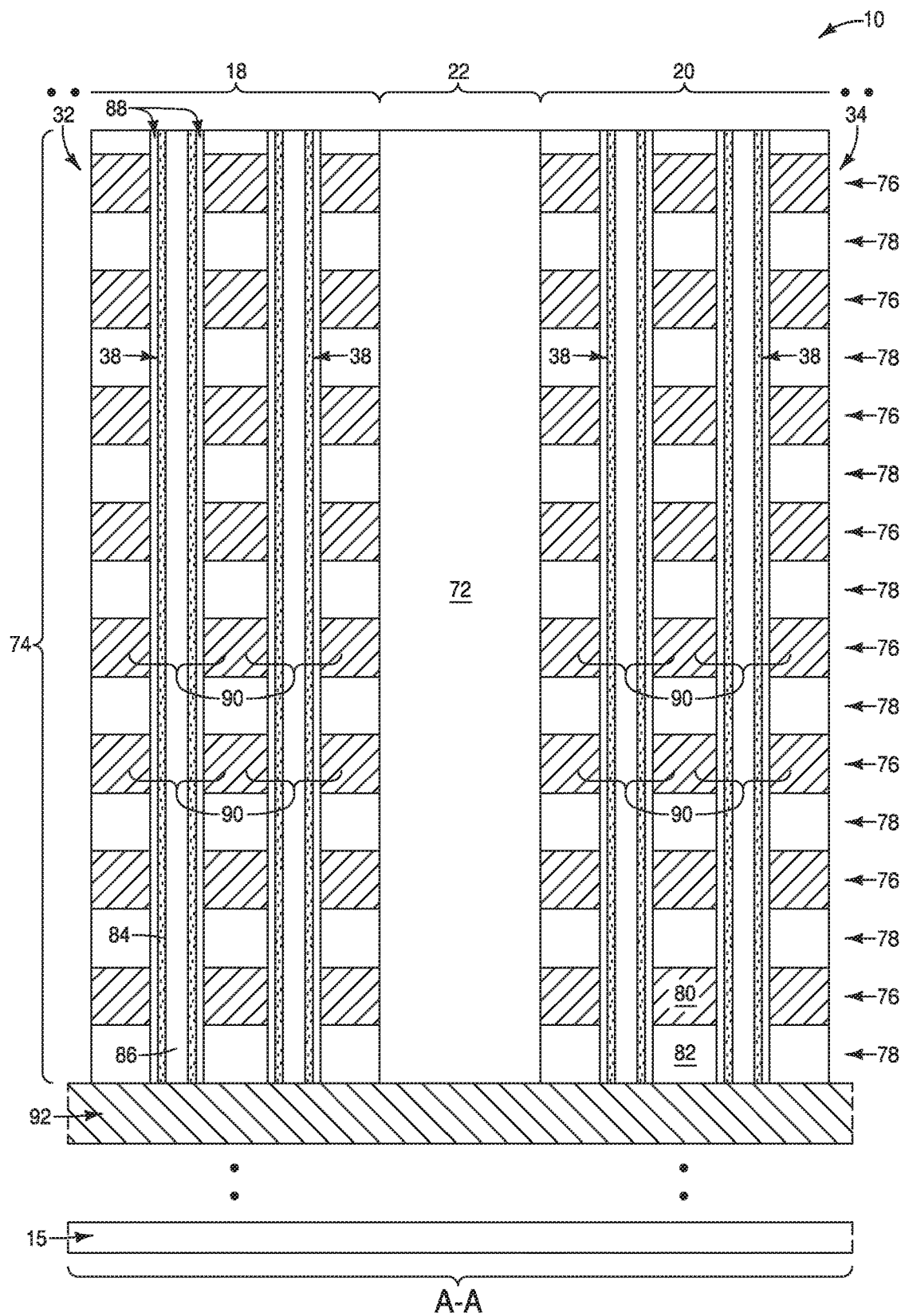
FIGS. 6-10 are diagrammatic cross-sectional side views of regions of the prior art integrated assembly of FIG. 5 along the lines A-A, B-B, C-C, D-D and E-E, respectively, of FIG. 5.
Figure 13:
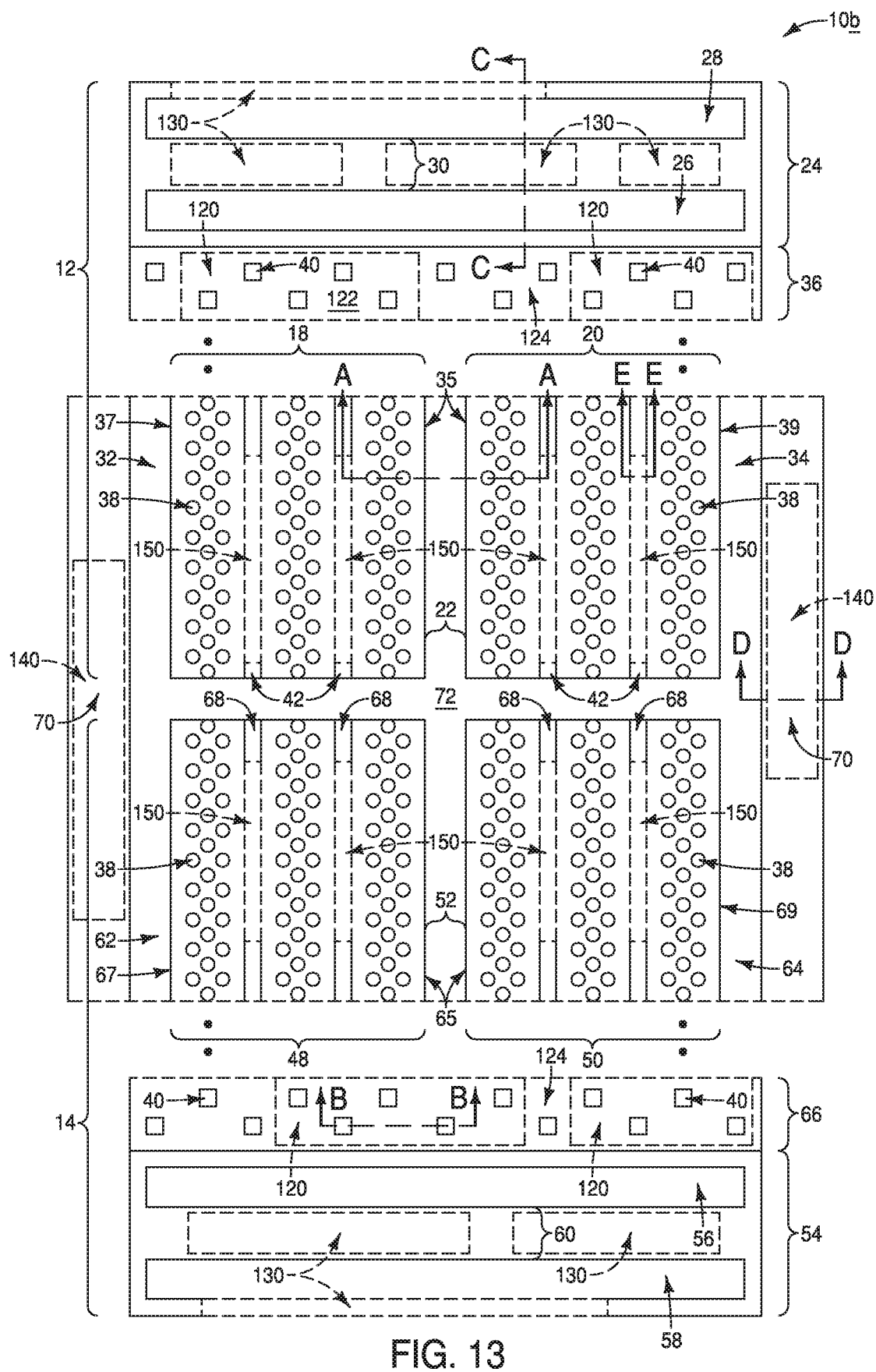
FIG. 13 is a diagrammatic top-down view of an example integrated assembly showing a pair of tiles associated with a semiconductor die.
Figure 14:
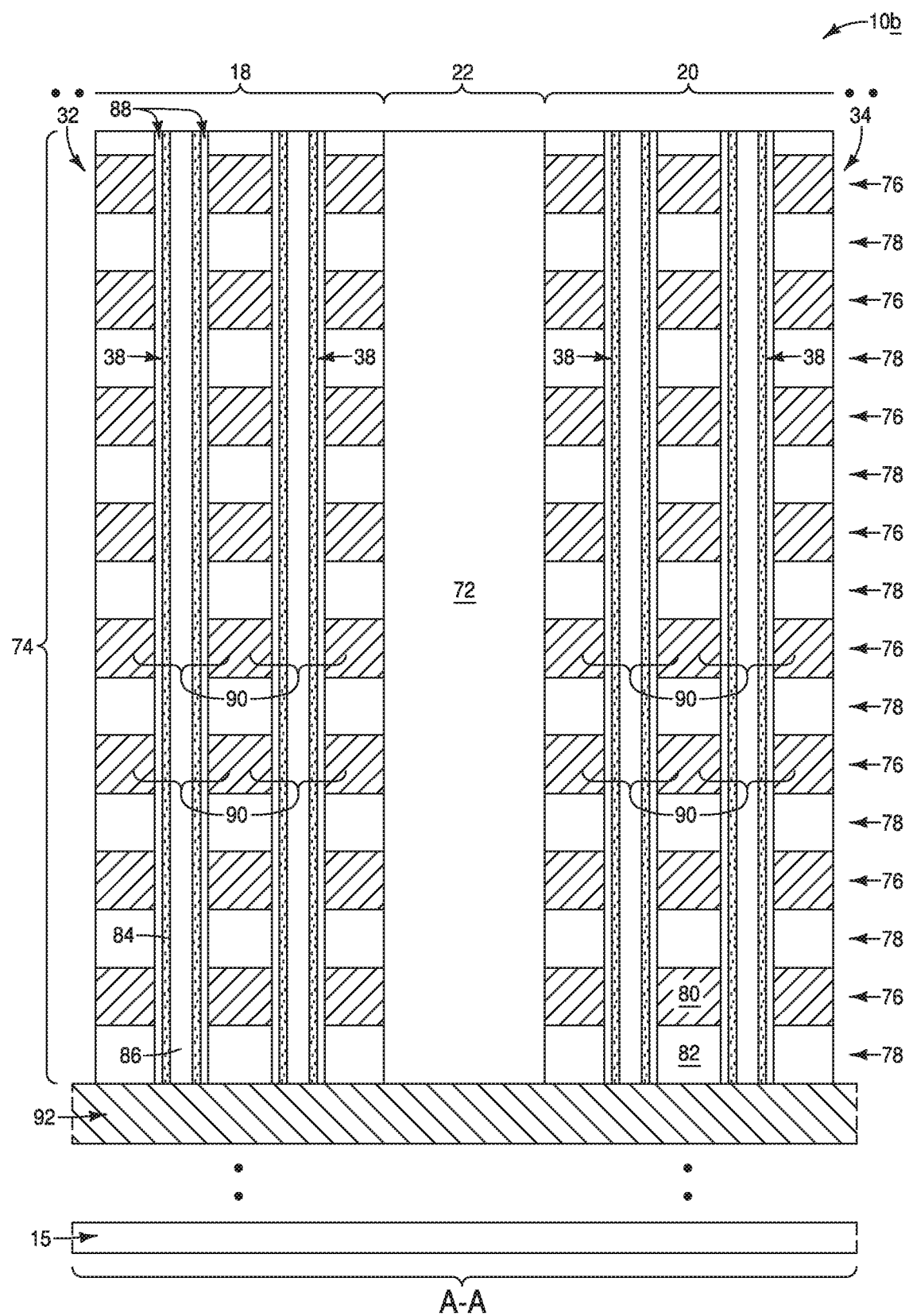
FIGS. 14-18 are diagrammatic cross-sectional side views of regions of the example integrated assembly of FIG. 13 along the lines A-A, B-B, C-C, D-D and E-E, respectively, of FIG. 13.

FIG. 14 is along the cross-section A-A of FIG. 13, and is identical to the configuration of FIG. 6. Specifically, in the shown embodiment there are no stress-moderating regions provided within the inter-block regions 22 and 52. In other embodiments (not shown) there may be stress-moderating regions provided within one or both of the inter-block regions 22 and 52.

Figure 15:
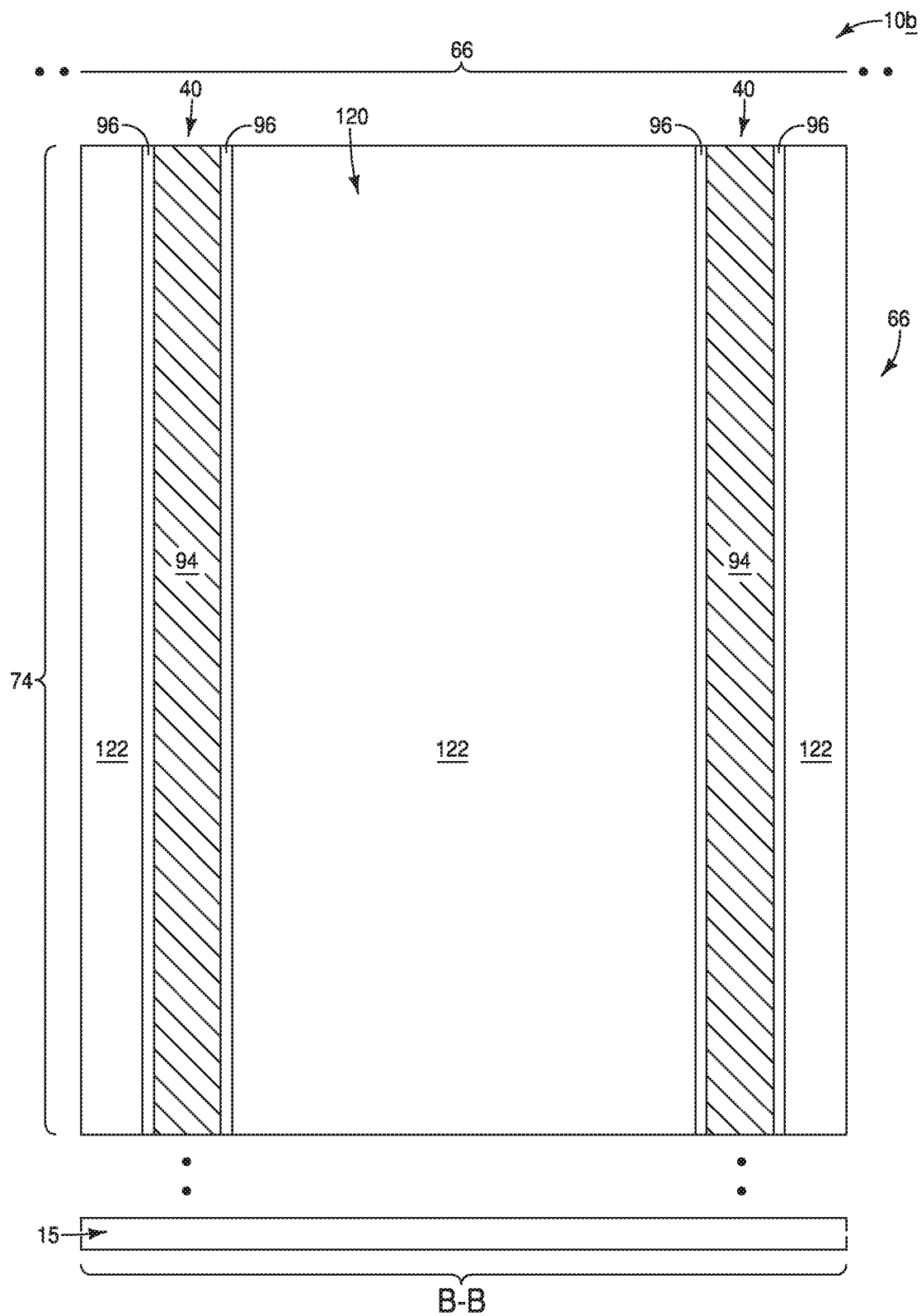

FIG. 15 is a view along the cross-section B-B of FIG. 13, and shows an example stress-moderating region 120 within the intervening region 66. The stress-moderating region extends entirely through the stack 74 (with the conductive levels 76 and insulative levels 78 of the stack 74 not being visible in the view of FIG. 15 in that such have been removed to form the stress-moderating region 120). The stress-moderating region 120 may be considered to comprise a trench formed to pass entirely through the stack 74 (or at least through all of the conductive levels of the stack 74), with such trench being subsequently filled with a stress-moderating material 122.

The material 122 may comprise any suitable composition(s). In some embodiments, the material 122 may comprise, consist essentially of, or consist of silicon dioxide. In some embodiments, the material 122 may comprise silicon in combination with one or more of nitrogen, oxygen and carbon. For instance, the material 122 may comprise, consist essentially of, or consist of a combination comprising silicon and oxygen, a combination comprising silicon and carbon, a combination comprising silicon and nitrogen, a combination comprising silicon, nitrogen and carbon, etc. In some embodiments, the material comprising silicon in combination with one or more of nitrogen, oxygen and carbon may be considered to be an example of a ceramic composition which may be utilized in the stress-moderating region 120.

Figure 7:
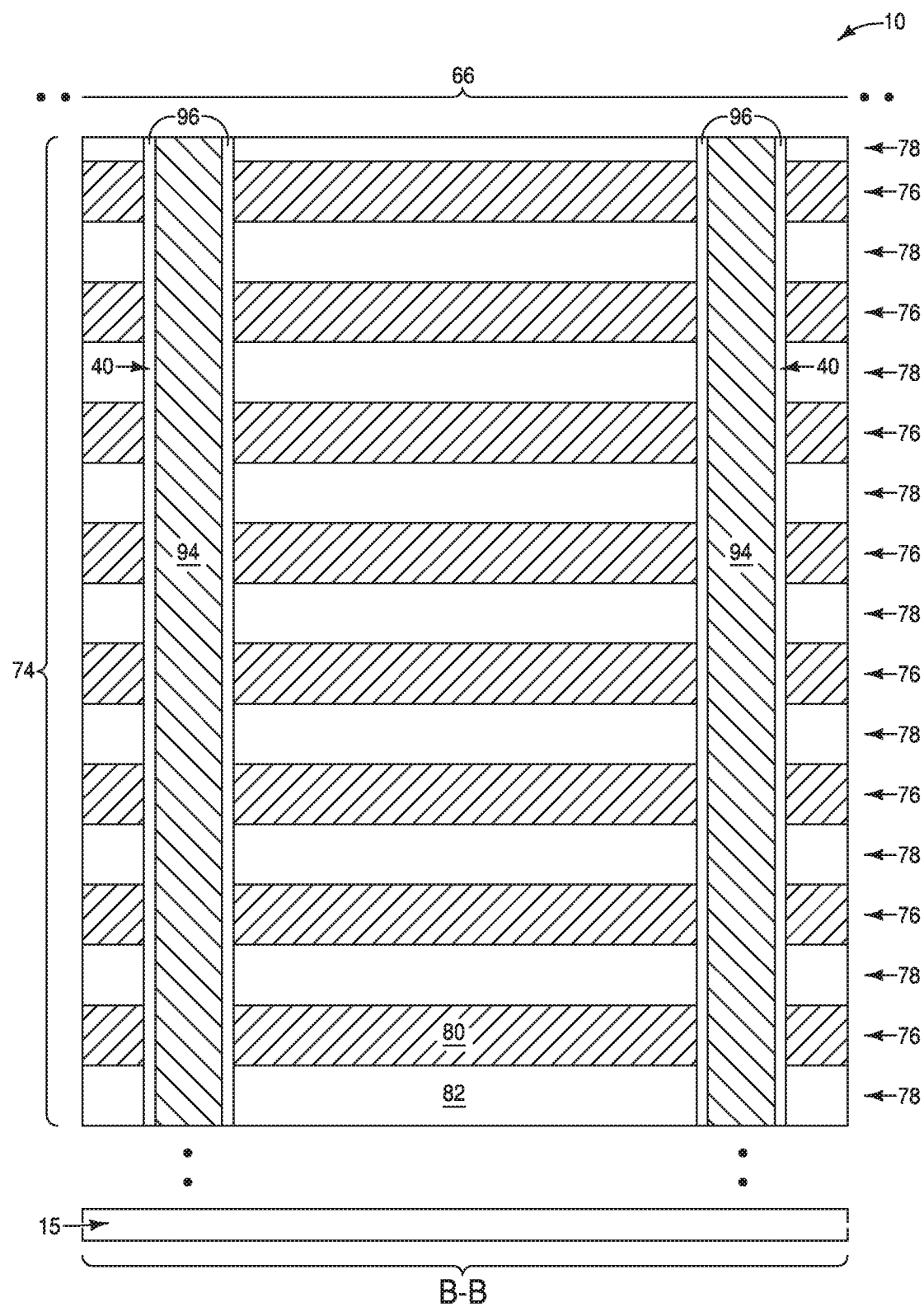
Figure 8:
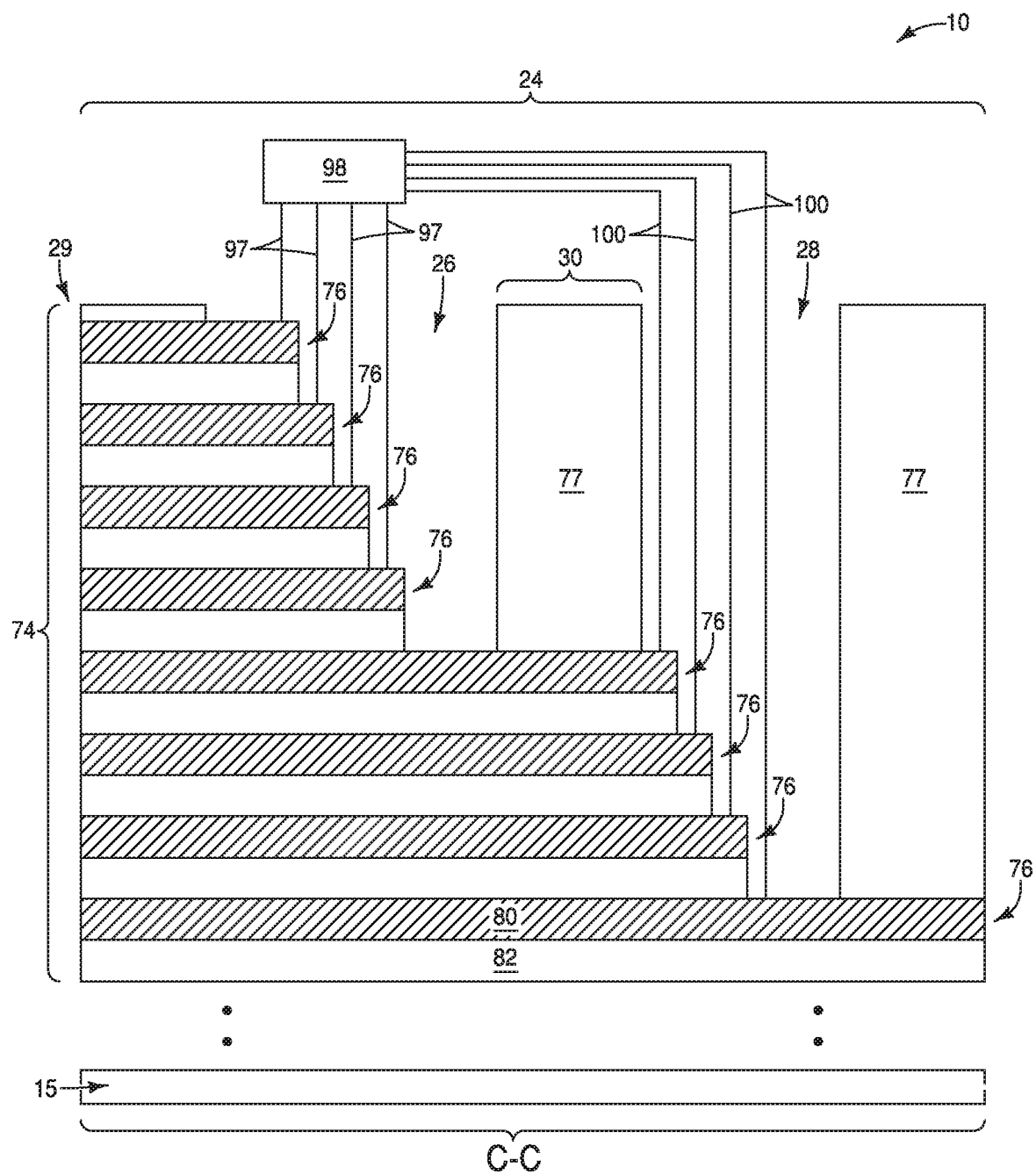
Figure 9:
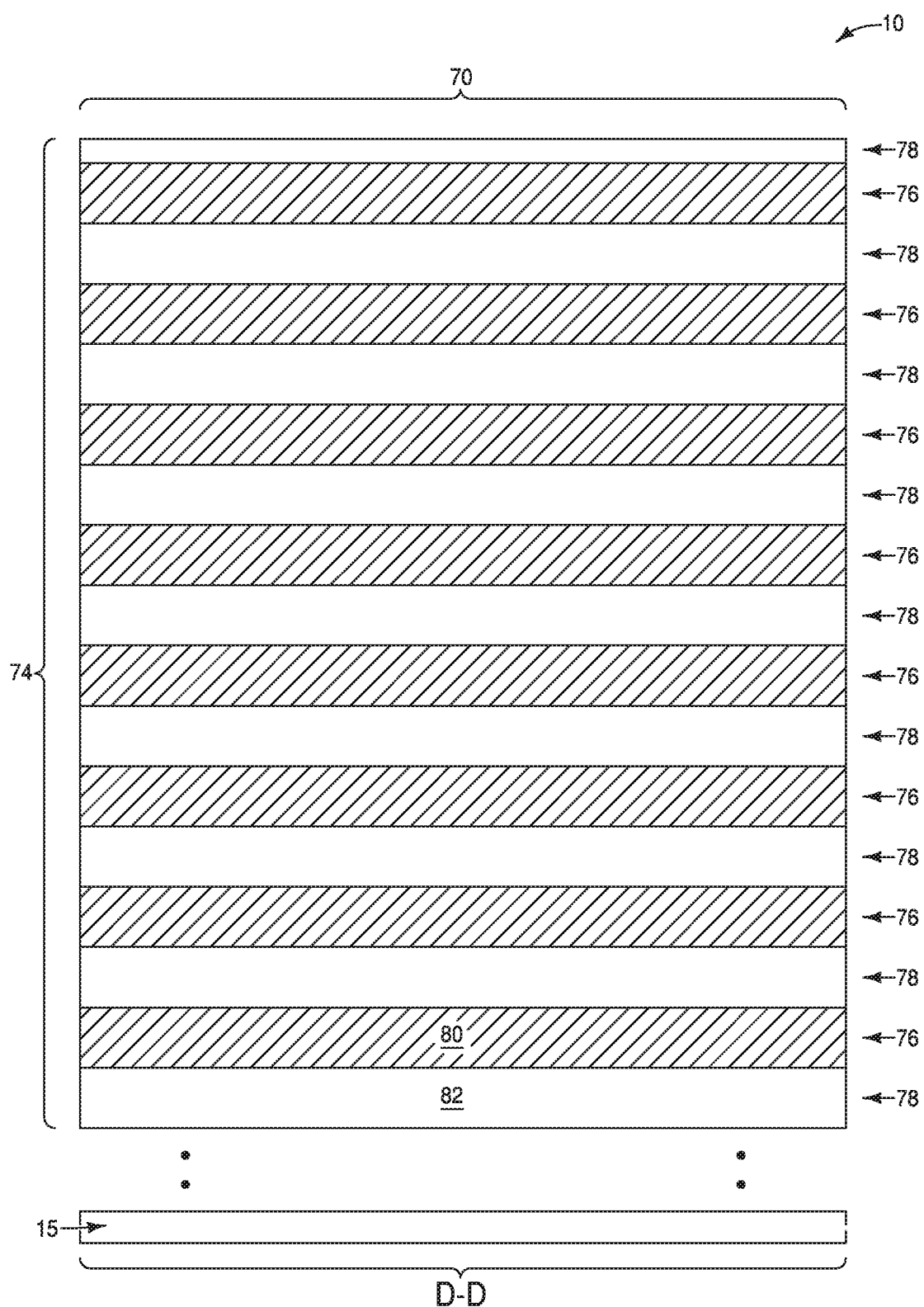
Figure 10:
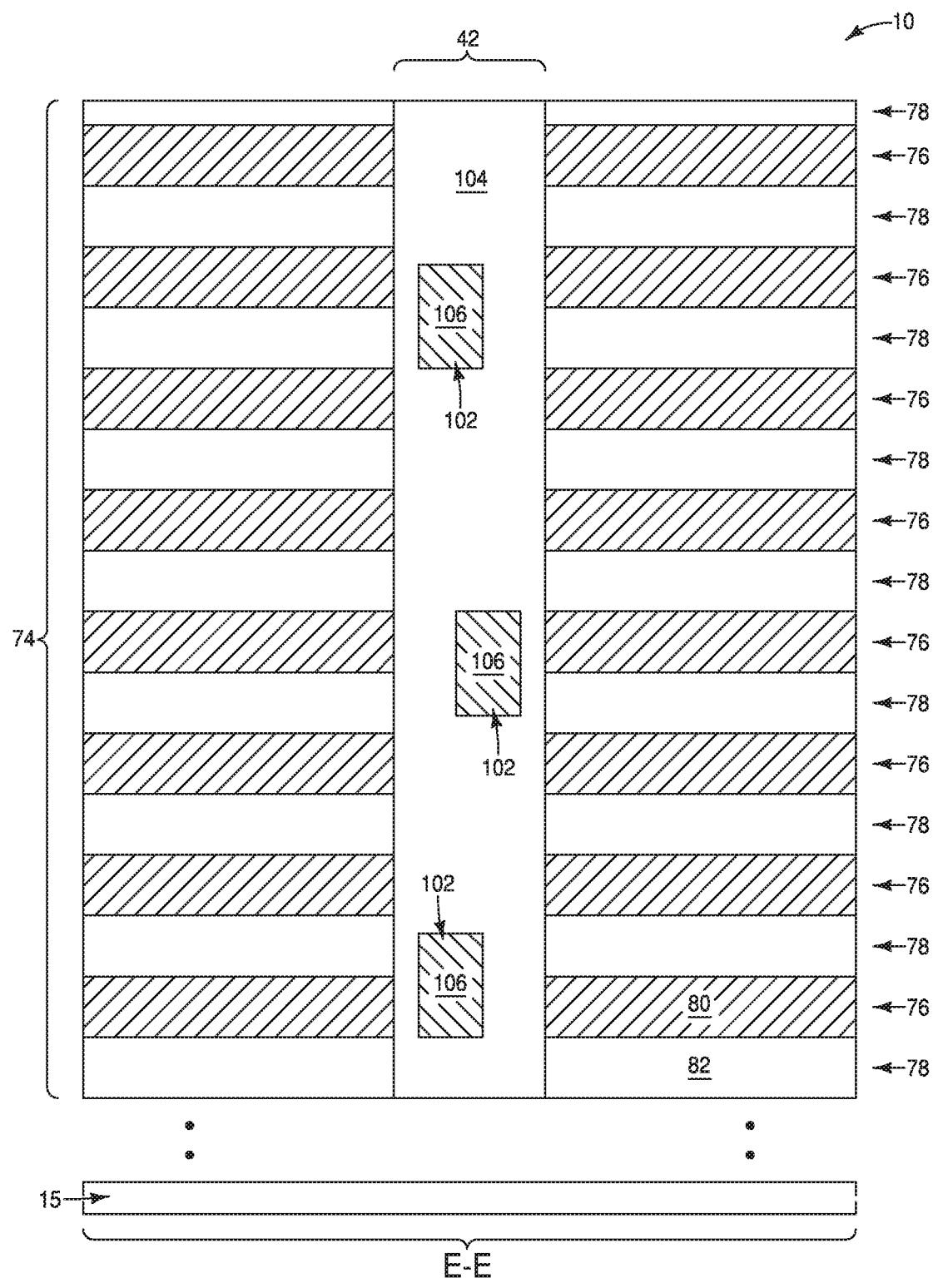

In the illustrated embodiment of FIGS. 13 and 15, the support structures 40 extend through the stress-moderating material 122 of the stress-moderating regions 120. In some embodiments, the support structures 40 may be considered to extend through a full vertical dimension of the stack 74 (with the conductive levels 76 and insulative levels 78 of the stack 74 not being visible in the view of FIG. 15, but being visible in FIG. 7), and the stress-moderating region 120 may also be considered to extend through the full vertical dimension of the stack 74. The stress-moderating material 122 may entirely fill the region 120 (as shown), or may only partially fill the region 120.

The stress-moderating regions 120 may be engineered to achieve a desired reduction in the overall bending stress across a die of the integrated assembly 10b. In some embodiments, the removal of a large amount of the metal-containing material 80 (FIG. 7) of the conductive levels 76 may substantially reduce stress across the die. The stresses created by the metal-containing material 80 may result from thermally-induced expansion/contraction of the conductive material and/or from any other mechanism. Regardless, removal of large portions of the metal-containing material from regions outward of the memory array regions (e.g., the regions 32, 34, 62 and 64 of FIG. 13) may reduce the overall problematic bending stresses associated with the semiconductor die 10b as compared to the conventional die 10 of FIG. 5-10.

The embodiment of FIG. 13 shows locations for multiple stress-moderating regions 120 within the intervening regions 36 and 66. Notably, the stress-moderating regions 120 are spaced from one another by bridge regions 124 within the intervening regions 36 and 66. The bridge regions enable segments of the conductive levels 76 to pass through the intervening regions to the interconnect (staircase) regions 24 and 54.

Figure 16:
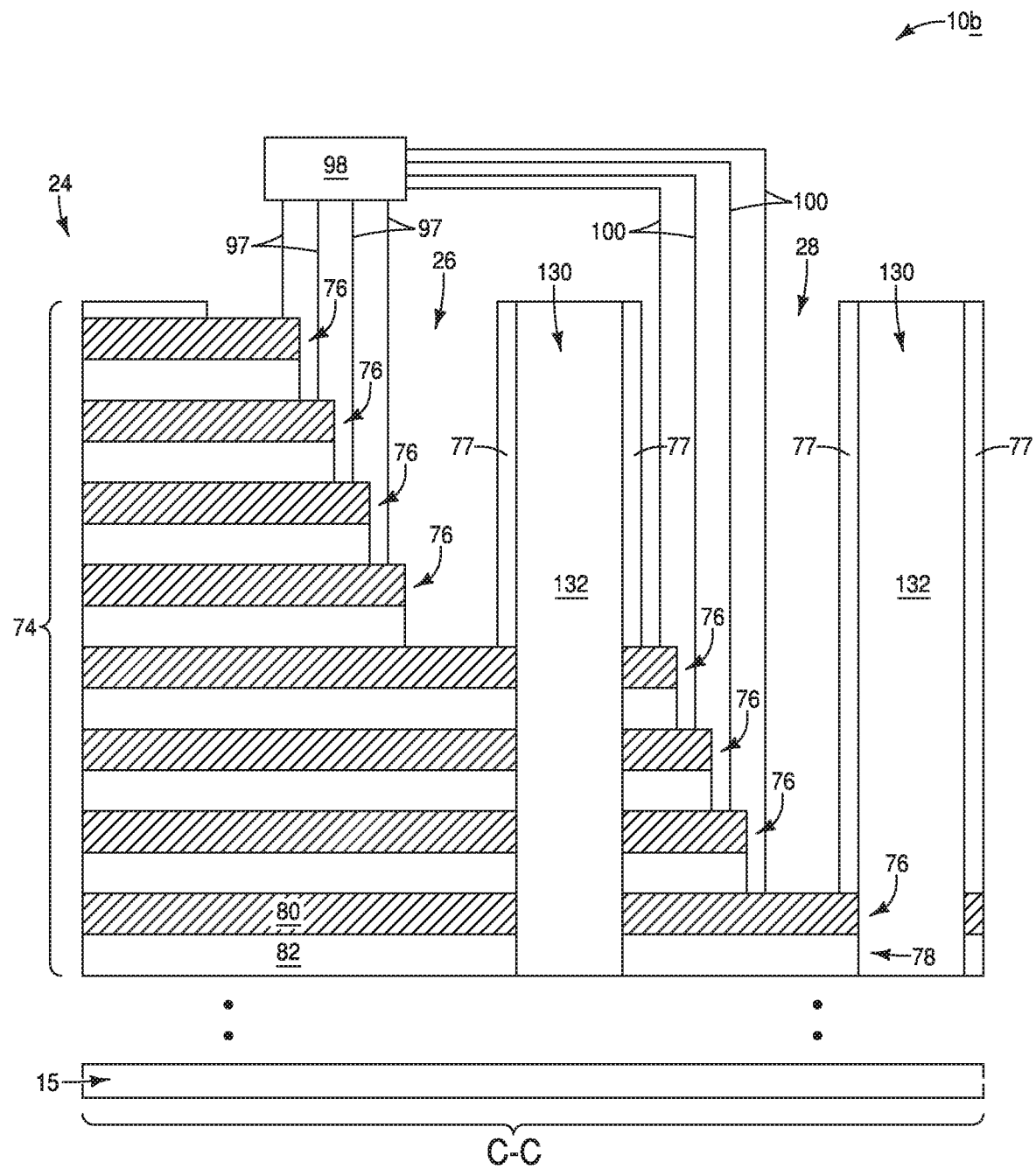

The stress-moderating regions 120 within the intervening regions 36 and 66 are only some of the stress-moderating regions which may be formed within the integrated assembly 10b of FIG. 13. Additional stress-moderating regions 130 may be formed within the interconnect regions (staircase regions) 24 and 54. In the shown embodiment, the stress-moderating regions 130 are between the spaced-apart trenches (e.g., 26 and 28) of the interconnect regions. FIG. 16 is a view along a cross-section C-C of FIG. 13, and shows example stress-moderating regions 130. Such stress-moderating regions extend through the insulative material 77 of the interconnect region 24, and in the shown embodiment pass entirely through the stack 74 of the conductive levels 76 and insulative levels 78. In other embodiments, one or more of the stress-moderating regions 130 may pass only partially through the stack 74.

The stress-moderating regions 130 comprise stress-moderating material 132. The material 132 at least partially fills the stress-moderating regions 130, and in some embodiments may entirely fill such stress-moderating regions. Such material may comprise any of the compositions described above with reference to the stress-moderating material 122 of FIG. 15. The stress-moderating material 132 may be a same composition as the stress-moderating material 122, or may be a different composition than the stress-moderating material 122.

In some embodiments, the interconnect regions 24 and 54 of FIG. 13 may be considered to be first and second interconnect regions, respectively; and the intervening regions 36 and 66 may be considered to be first and second intervening regions, respectively. The stress-moderating regions 120 within the first intervening structure 36 may be considered to be first stress-moderating regions, while those within the second intervening structure 66 may be considered to be second stress-moderating regions. The stress-moderating regions 130 within the first interconnect region 24 may be considered to be third stress-moderating regions, and the stress-moderating regions 130 within the second interconnect region 54 may be considered to be fourth stress-moderating regions. The first, second, third and fourth stress-moderating regions may all comprise a same stress-moderating material as one another; or at least one of such stress-moderating regions may comprise a different stress-moderating material relative to another of such stress-moderating regions.

Figure 17:
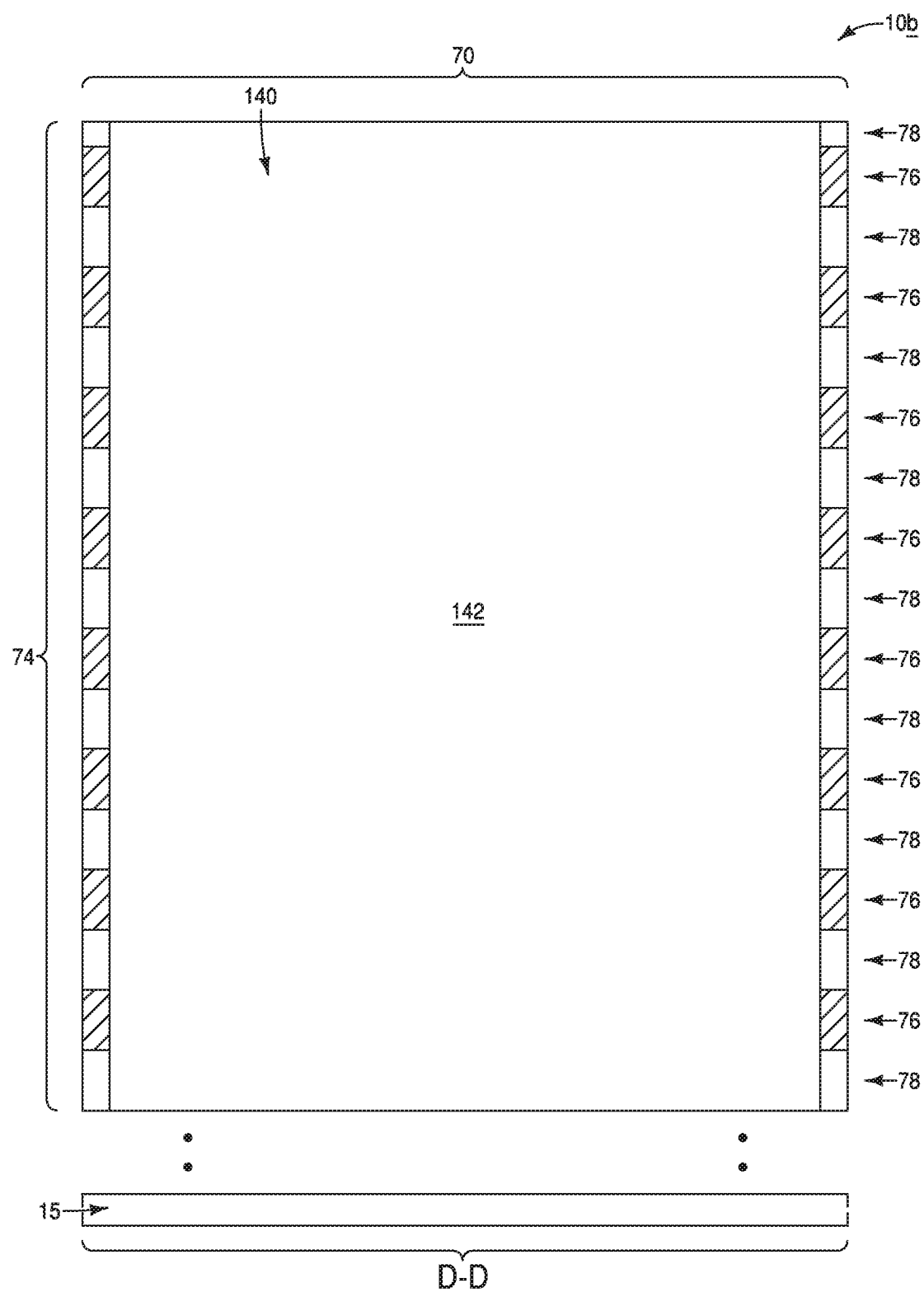

Additional stress-moderating regions 140 may be formed within the peripheral regions 70. FIG. 17 is a view along a cross-section D-D of FIG. 13, and shows an example stress-moderating region 140. The example stress-moderating region 140 extends entirely through the stack 74. In other embodiments, the stress-moderating region 140 may extend only partially through the stack 74.

The stress-moderating region 140 comprises stress-moderating material 142. The material 142 at least partially fills the stress-moderating region 140, and in some embodiments may entirely fill such stress-moderating region. The material 142 may comprise any of the compositions described above with reference to the stress-moderating material 122 of FIG. 15. The stress-moderating material 142 may be a same composition as the stress-moderating material 122, or may be a different composition than the stress-moderating material 122.

Figure 18:
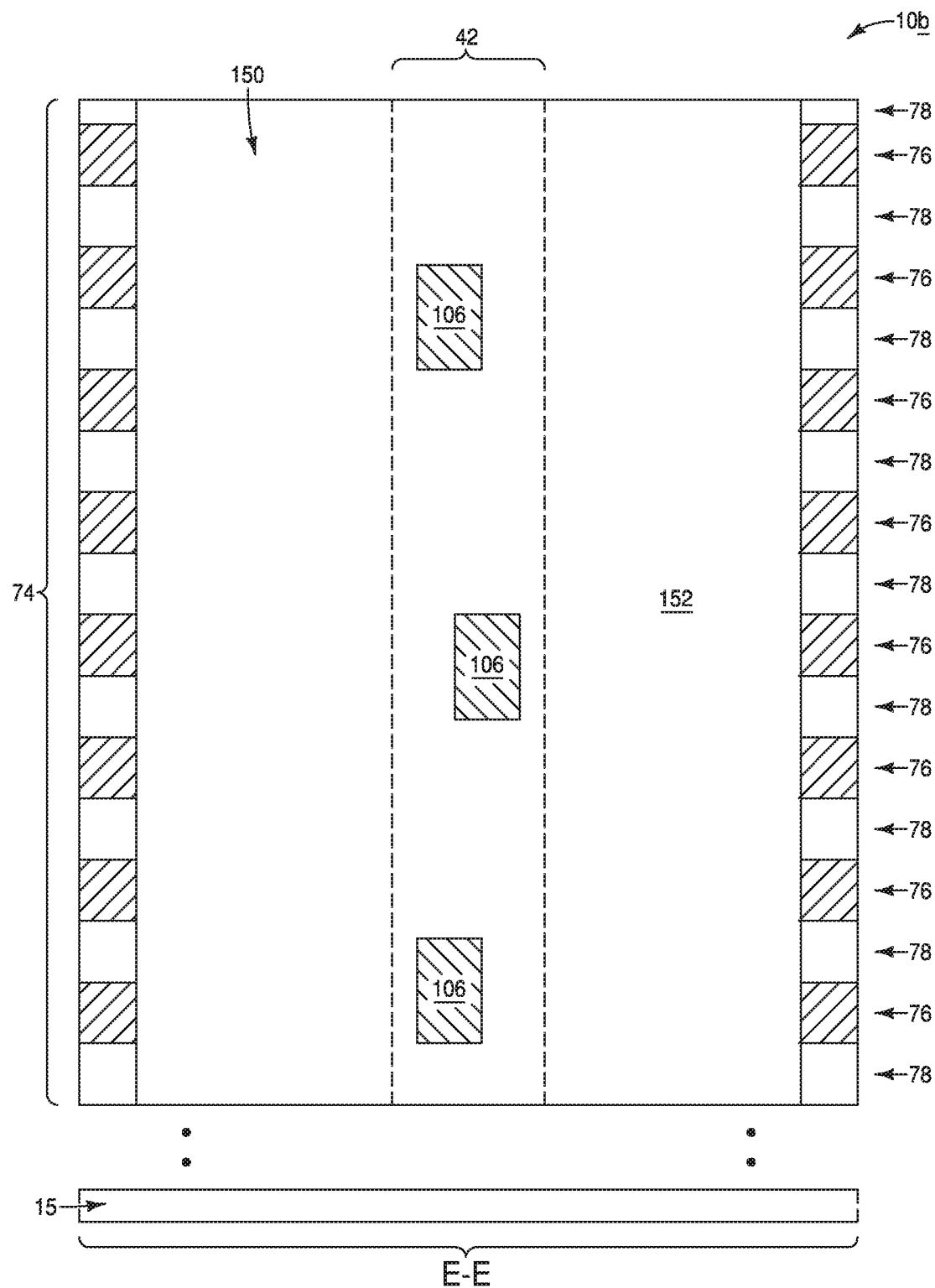

Additional stress-moderating regions 150 may be formed along the routing regions 42 and 68. FIG. 18 is a view along a cross-section E-E of FIG. 13, and shows an example stress-moderating region 150. The example stress-moderating region 150 extends entirely through the stack 74. In other embodiments, the stress-moderating region 150 may extend only partially through the stack 74.

The stress-moderating regions 150 comprise stress-moderating material 152. The material 152 at least partially fills the stress-moderating regions 150, and in some embodiments may entirely fill such stress-moderating regions. The material 152 may comprise any of the compositions described above with reference to the stress-moderating material 122 of FIG. 15. The stress-moderating material 152 may be a same composition as the stress-moderating material 122, or may be a different composition than the stress-moderating material 122.

The routing region 42 is diagrammatically illustrated in FIG. 18. In the shown embodiment, the stress-moderating material 152 extends entirely across the routing region 42. In other embodiments, a different material may be within the routing region 42, and the material 152 may be laterally along the routing region 42. For instance, in some embodiments the insulative material 104 (FIG. 10) may remain within the routing region 42, and the stress-moderating material 152 may be formed laterally along such insulative material. The stress-moderating regions 150 may encompass the entirety of one or more of the routing regions (e.g., 42 and 68), or may comprise only portions of one or more of the routing regions.

Figure 11:
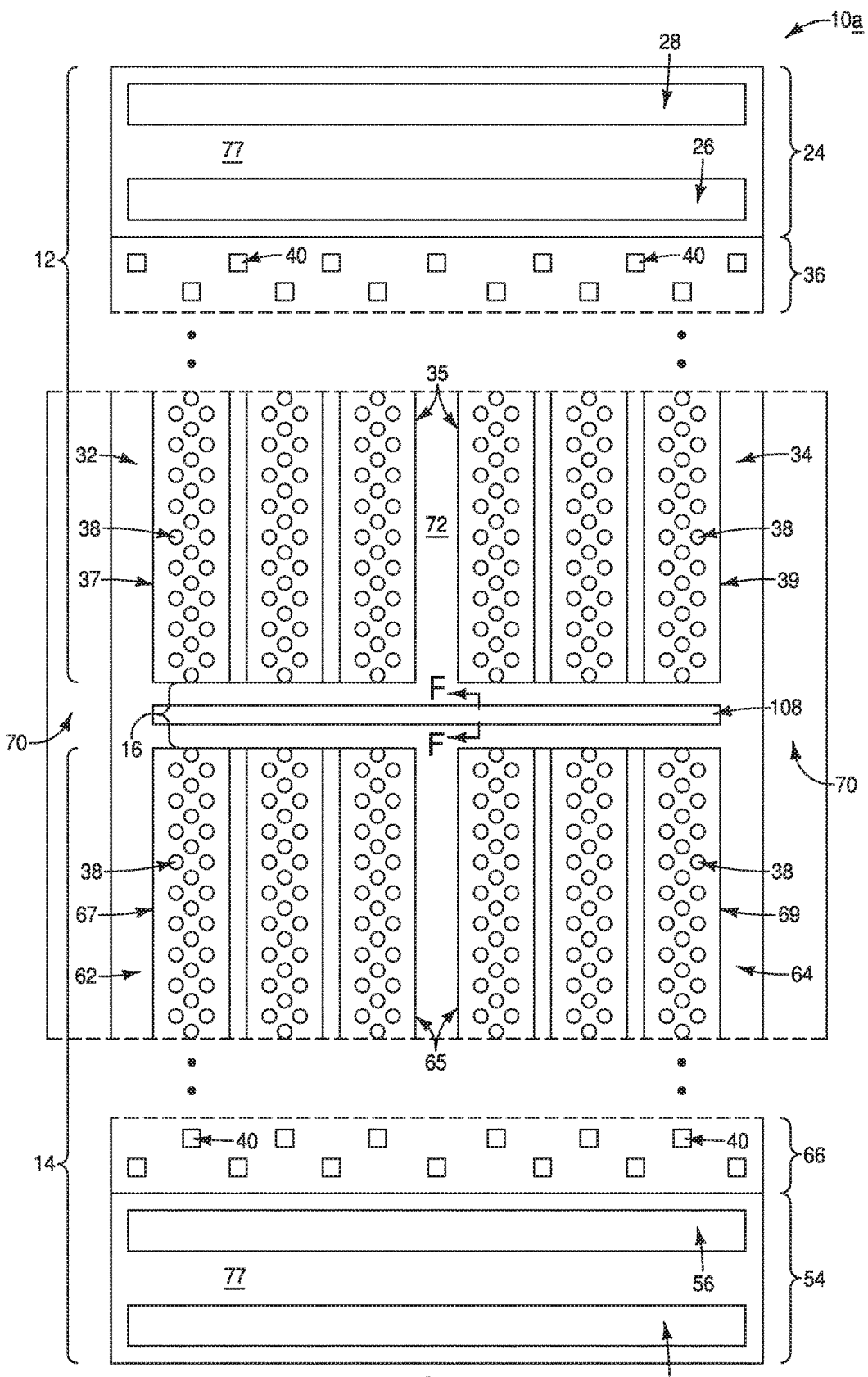
FIG. 11 is a diagrammatic top-down view of a prior art integrated assembly showing a pair of tiles associated with a semiconductor die.
Figure 12:
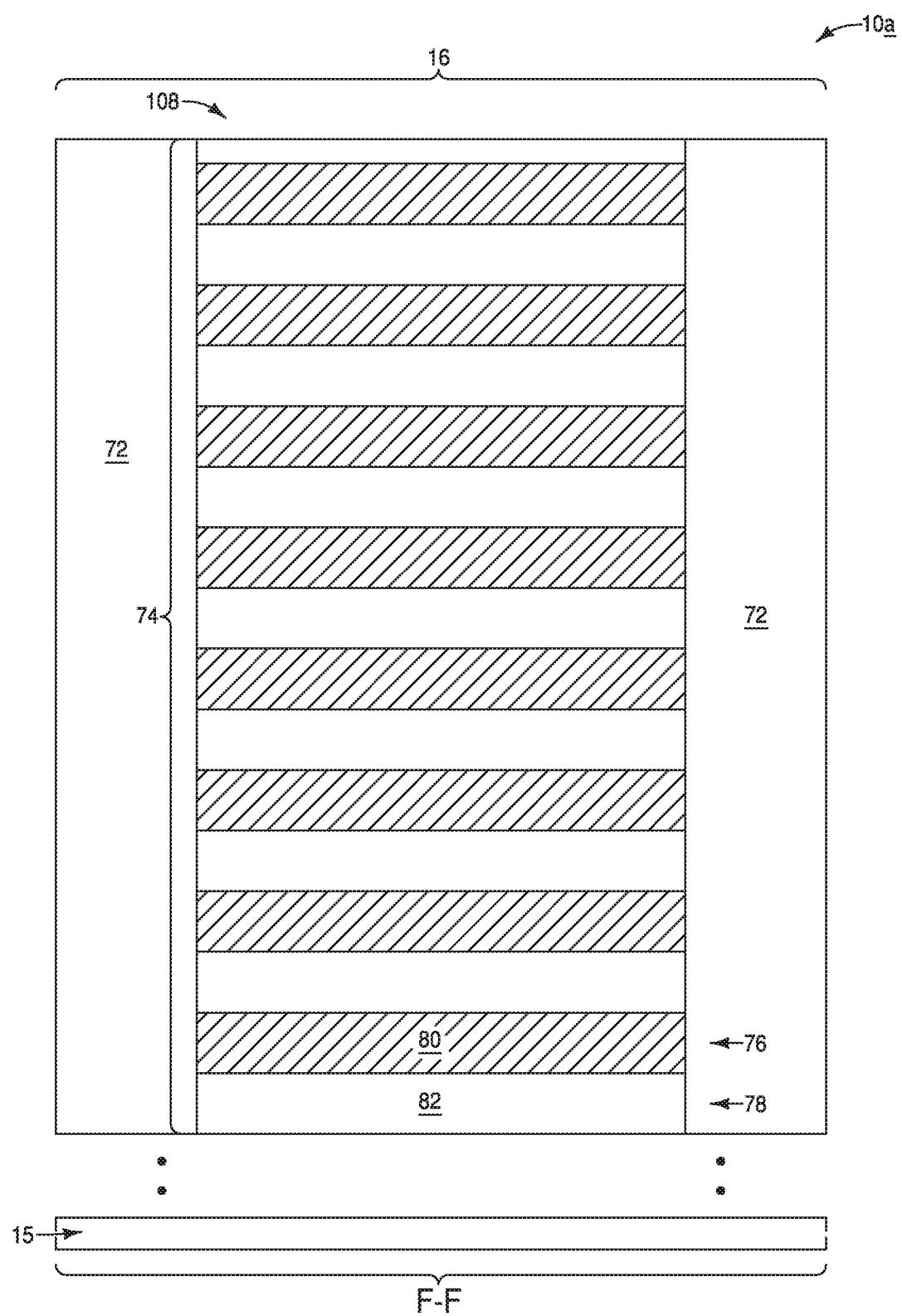
FIG. 12 is a diagrammatic cross-sectional side view of a region of the prior art integrated assembly of FIG. 11 along the line F-F of FIG. 11.
Figure 19:
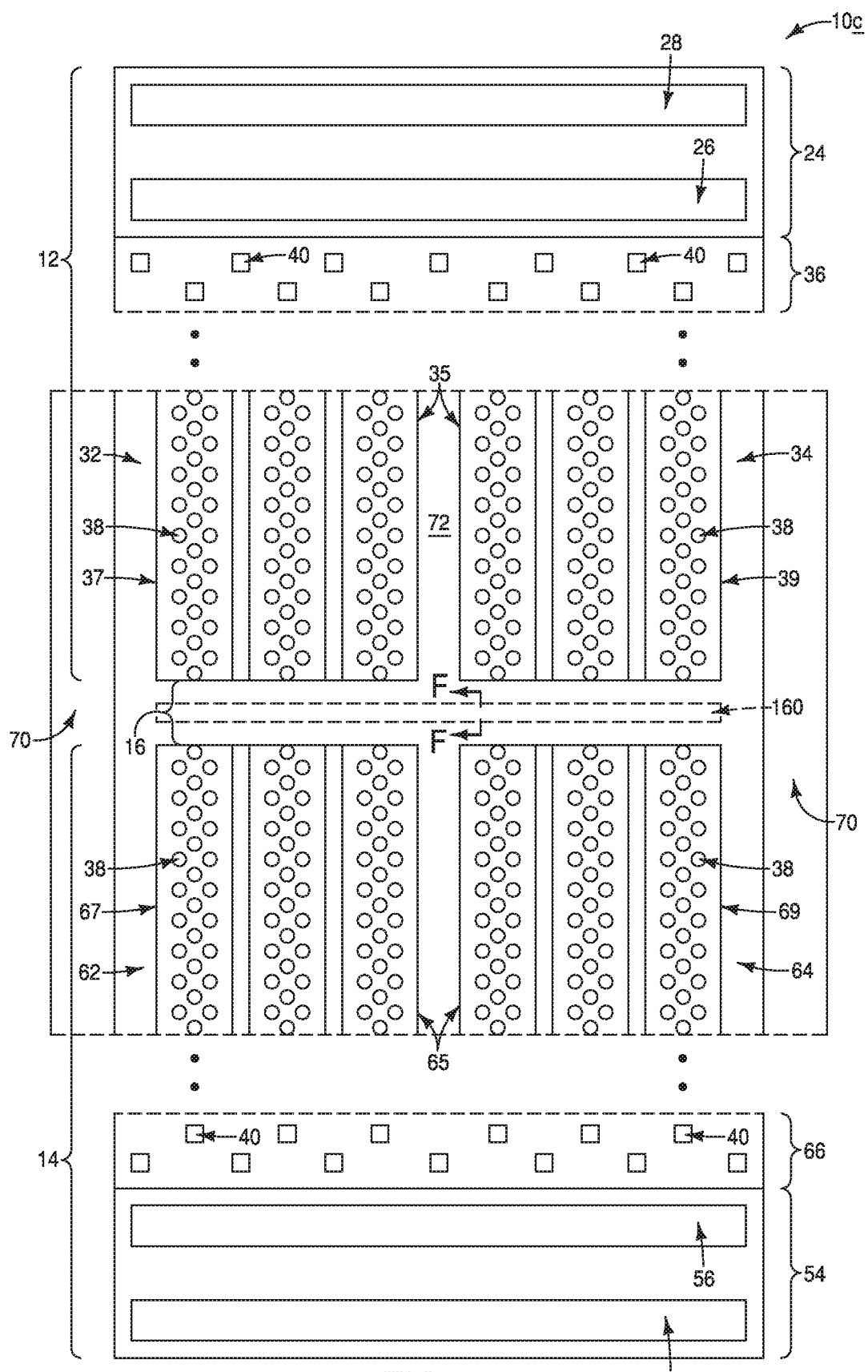
FIG. 19 is a diagrammatic top-down view of an example integrated assembly showing a pair of tiles associated with a semiconductor die.
Figure 20:
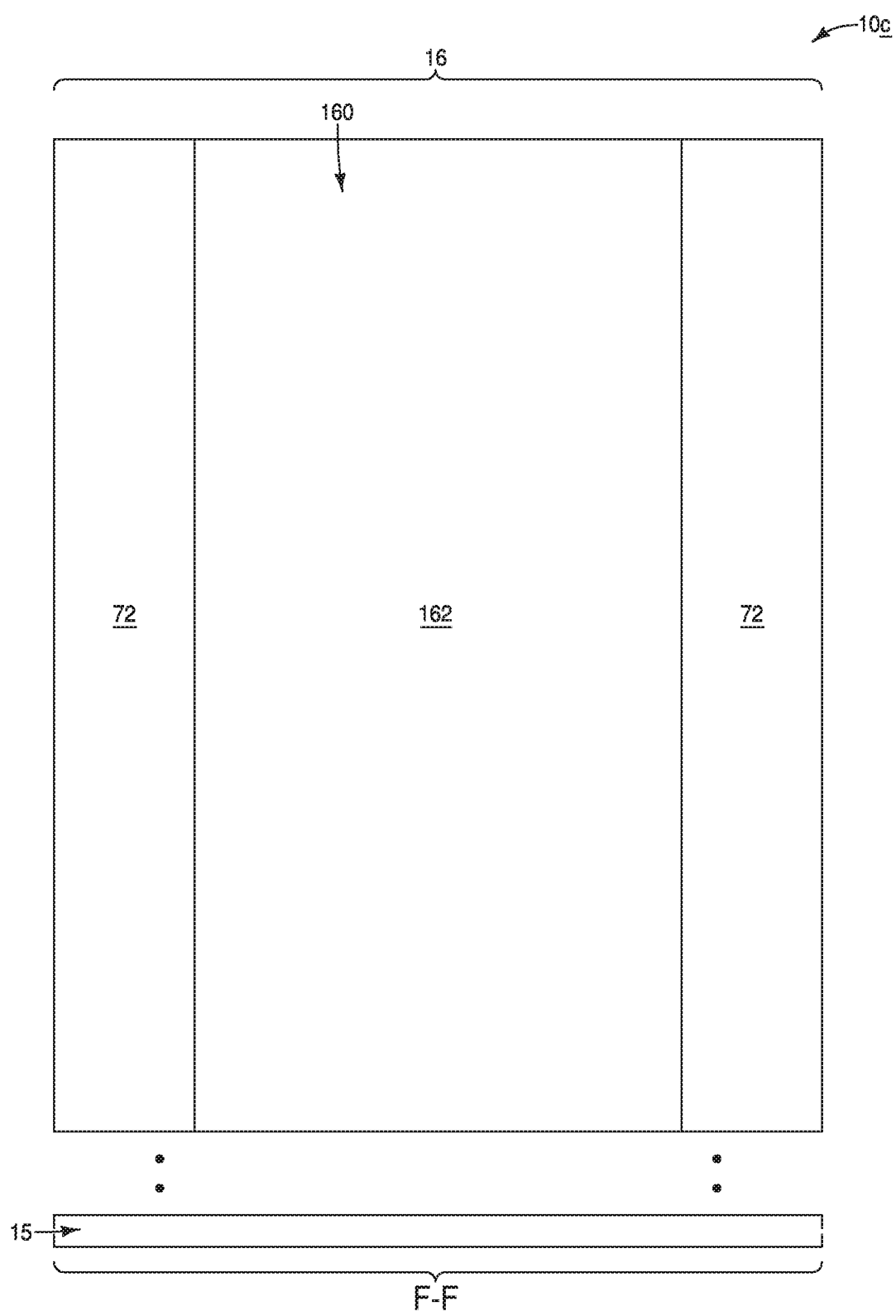
FIG. 20 is a diagrammatic cross-sectional side view of a region of the example integrated assembly of FIG. 19 along the line F-F of FIG. 19.

FIG. 19 shows an integrated assembly 10c analogous to the assembly described above with reference to FIG. 11, and shows that one or more additional stress-moderating regions 160 may be formed along the inter-tile region 16 to remove at least some of the conductive material 80 of the block 108 (shown in FIG. 12). For instance, FIG. 20 shows a cross-section along the line F-F of FIG. 19, and shows the stress-moderating region 160 entirely replacing the conductive materials 80 of the block 108 (FIG. 12). The stress-moderating region 160 extends entirely through the stack 74 (FIG. 12) in the shown embodiment. In other embodiments, the stress-moderating region may extend only partially through the stack. A stress-moderating material 162 is within the stress-moderating region 160. In the shown embodiment, the stress-moderating material 162 entirely fills the stress-moderating region 160. In other embodiments, the stress-moderating material 162 may only partially fill the stress-moderating region.

The stress-moderating material 162 may comprise any of the compositions described above with reference to the stress-moderating material 122 of FIG. 15. The stress-moderating material 162 may comprise a same composition as the stress-moderating material 122, or may comprise a different composition relative to the stress-moderating material 122.

The stress-moderating region 160 is shown relative to the configuration 10c of FIG. 19 rather than being shown relative to the configuration 10b of FIG. 13 in order to simplify the illustration of the stress-moderating region 160. However, it is to be understood that the stress-moderating region 162 may be utilized in combination with any of the stress-moderating regions 120, 130, 140 and 150 of FIG. 13.

Any of the above-discussed stress-moderating materials 122, 132, 142, 152 and 162 may comprise a same composition as one another, or may comprise different compositions relative to one another. Also, any of the stress-moderating regions 120, 130, 140, 150 and 160 may be utilized, either alone, or in combination with one or more others of the stress-moderating regions. In some embodiments, it is recognized that it may be advantageous to remove a large portion of the excess conductive material 80 of the conventional die configurations of FIGS. 5-12 in order to substantially alleviate problematic die-bending induced by the excess conductive material. The term "excess conductive material" refers to conductive material 80 which is not utilized for wordline routing within the memory array regions (e.g., 32), and which is not utilized for coupling to interconnects within the interconnect regions (e.g., 24).

A total combined area of the stress-moderating region(s) (i.e., one or more of the regions 120, 130, 140, 150 and 160) utilized relative to a semiconductor die may be comparable to the overall size of memory array region(s) associated with the die. For instance, the total combined area of the stress-moderating region(s) may be at least 5% of a total area of the memory array region(s), at least about 10% of the total area of the memory array region(s), at least about 20% of the total area of the memory array region(s), etc. For instance, in the embodiments of FIGS. 13 and 19 the memory array regions 32, 34, 62 and 64 may be together considered to have a total combined area. The stress-moderating regions 120, 130, 140, 150 and 160 may be together considered to have another total combined area. The total combined area of the stress-moderating regions may be at least about 5% of the total combined area of the memory array regions, at least about 10% of the total combined area of the memory array regions, at least about 20% of the total combined area of the memory regions, etc.

In some embodiments, the routing regions 42 and 68 may be considered to be within the memory array regions 32, 34, 62 and 64; and accordingly the stress-moderating regions 150 may also be considered to be within the memory array regions 32, 34, 62 and 64. In contrast, the other stress-moderating regions 120, 130, 140 and 160 are not within the memory array regions (i.e., are external to the memory array regions).

Although the stress-moderating materials 122, 132, 142, 152 and 162 are shown to be homogeneous compositions within the embodiments of FIGS. 13-20, it is to be understood that one or more of such materials may comprise two or more discrete compositions. For instance, in some embodiments a stress-moderating material may comprise a liner along an outer periphery of a stress-moderating region, and may comprise a fill within the liner. The fill and the liner may comprise different compositions relative to one another, or may comprise a same composition as one another.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a semiconductor die with one or more memory array regions and with one or more regions peripheral to the memory array regions. The one or more memory array regions have a total area. A stack of alternating insulative and conductive levels extends across the one or more memory array regions and passes into at least one of the regions peripheral to the one or more memory array regions. The stack generates bending stresses on the die. At least one stress-moderating region extends through the stack and is configured to alleviate the bending stresses. A total of all of the stress-moderating regions has an area which is at least about 5% of the total area of the one or more memory array regions.

Some embodiments include an integrated assembly comprising a semiconductor die having a first memory device tile adjacent to a second memory device tile. The first and second memory device tiles are spaced from one another by an inter-tile region. The first memory device tile has a first memory array region, and the second memory device tile has a second memory array region. A stack of alternating insulative and conductive levels extends across the first and second memory array region. A segment of the stack is within the inter-tile region. The stack generates bending stresses on the die. A stress-moderating region extends through the segment of the stack and is filled with a stress-moderating material.

Some embodiments include an integrated assembly comprising a semiconductor die having a memory array region. A stack of alternating insulative and conductive levels extends across the memory array region. An interconnect region is adjacent to the memory array region and is configured for establishing connections to the individual conductive levels of the stack. An intervening region is between the interconnect region and the memory array region. A first stress-moderating region is within the intervening region. A second stress-moderating region is within the interconnect region. The first and second stress-moderating regions extend through the stack and are filled with stress-moderating material. The stress-moderating material comprises silicon and one or more of nitrogen, carbon and oxygen.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly comprising:
   a semiconductor die having one or more memory array regions and one or more regions peripheral to the one or more memory array regions; the one or more memory array regions having a total area;
   a stack of alternating insulative and conductive levels extending across the one or more memory array regions and passing into at least one of the regions peripheral to the one or more memory array regions; the stack generating bending stresses on the die; and
   one or more stress-moderating regions extending through the stack and configured to alleviate the bending stresses; the one or more stress-moderating regions together having an area which is at least about 5% of the total area of the one or more memory array regions.

2. The integrated assembly of claim 1 wherein at least one of the stress-moderating regions is within one of the one or more memory array regions.

3. The integrated assembly of claim 1 wherein at least one of the stress-moderating regions is not within one of the one or more memory array regions.

4. The integrated assembly of claim 1 wherein:
   the semiconductor die has an interconnect region adjacent to one of the one or more memory array regions and configured for establishing connections to the individual conductive levels of the stack;
   the semiconductor die has an intervening region between the interconnect region and said one of the one or more memory array regions, and has support structures extending upwardly through a full vertical dimension of the stack within the intervening region; and at least one of the stress-moderating regions is within the intervening region.

5. The integrated assembly of claim 4 wherein said at least one of the stress-moderating regions is filled with a stress-moderating material, and wherein the support structures extend through the stress-moderating material.

6. The integrated assembly of claim 5 wherein the stress-moderating material comprises silicon dioxide.

7. The integrated assembly of claim 5 wherein the stress-moderating material comprises a ceramic composition.

8. The integrated assembly of claim 7 wherein the ceramic composition includes silicon and one or more of nitrogen, oxygen and carbon.

9. The integrated assembly of claim 4 wherein said at least one of the stress-moderating regions is a first stress-moderating region, and further comprising a second stress-moderating region within the interconnect region.

10. The integrated assembly of claim 9 wherein the interconnect region comprises spaced-apart trenches for establishing the connections to different sets of the conductive levels, and wherein the second stress-moderating region is between the spaced-apart trenches.

11. The integrated assembly of claim 1 wherein the area of the one or more stress-moderating regions is at least about 10% of the total area of the one or more memory array regions.

12. The integrated assembly of claim 1 wherein the area of the one or more stress-moderating regions is at least about 20% of the total area of the one or more memory array regions.

13. The integrated assembly of claim 1 wherein the conductive levels comprise metal.

14. The integrated assembly of claim 1 wherein the conductive levels comprise tungsten.

15. An integrated assembly comprising:
a semiconductor die having a first memory device tile adjacent to a second memory device tile; the first and second memory device tiles being spaced from one another by an inter-tile region; the first memory device tile having a first memory array region, and the second memory device tile having a second memory array region;
a stack of alternating insulative and conductive levels extending across the first and second memory array regions; a segment of the stack being within the inter-tile region; the stack generating bending stresses on the die;
a stress-moderating region extending through the segment of the stack and being filled with a stress-moderating material; and
wherein the stress-moderating material comprises silicon dioxide.

16. The integrated assembly of claim 15 comprising first and second routing regions within the first and second memory array regions, respectively; wherein the stress-moderating region is a first stress-moderating region; and further comprising a second stress-moderating region encompassing at least a portion of the first routing region and a third stress-moderating region encompassing at least a portion of the second routing region.

17. The integrated assembly of claim 16 wherein stress-moderating material is a first stress-moderating material; and wherein the second and third stress-moderating regions are filled with a second stress-moderating material.

18. The integrated assembly of claim 17 wherein the second stress-moderating material comprises a same composition as the first stress-moderating material.

19. The integrated assembly of claim 17 wherein the second stress-moderating material comprises a different composition relative to the first stress-moderating material.

20. The integrated assembly of claim 15 wherein:
the semiconductor die has a first interconnect region adjacent to the first memory array region and configured for establishing connections to the individual conductive levels of the stack;
the semiconductor die has a second interconnect region adjacent to the second memory array region and configured for establishing connections to the individual conductive levels of the stack;
the semiconductor die has a first intervening region between the first interconnect region and the first memory array region, and has first support structures extending upwardly through a full vertical dimension of the stack within the first intervening region;
the semiconductor die has a second intervening region between the second interconnect region and the second memory array region, and has second support structures extending upwardly through a full vertical dimension of the stack within the second intervening region;
the stress-moderating region is a first stress-moderating region; and
second and third stress-moderating regions are within the first and second intervening regions, respectively.

21. The integrated assembly of claim 20 wherein the stress-moderating material is a first stress-moderating material, and wherein the second and third stress-moderating regions are filled with a second stress-moderating material.

22. The integrated assembly of claim 21 wherein the first and second support structures extend through the second stress-moderating material.

23. The integrated assembly of claim 21 wherein the second stress-moderating material comprises a same composition as the first stress-moderating material.

24. The integrated assembly of claim 21 wherein the second stress-moderating material comprises a different composition relative to the first stress-moderating material.

25. An integrated assembly comprising:
a semiconductor die having a memory array region;
a stack of alternating insulative and conductive levels extending across the memory array region;
an interconnect region adjacent to the memory array region and configured for establishing connections to the individual conductive levels of the stack;
an intervening region between the interconnect region and the memory array region;
a first stress-moderating region within the intervening region;
a second stress-moderating region within the interconnect region;
the first and second stress-moderating regions extending through the stack and being filled with stress-moderating material; the stress-moderating material comprising silicon and one or more of nitrogen, carbon and oxygen; and
wherein the first stress-moderating region is only partially filled with stress-moderating material.

26. The integrated assembly of claim 25 wherein the interconnect region comprises spaced-apart trenches for establishing the connections to different sets of the conductive levels, and wherein the second stress-moderating region is between the spaced-apart trenches.

27. The integrated assembly of claim 25 comprising one or more routing regions within the memory array region; and further comprising a third stress-moderating region encompassing a portion of at least one of the routing regions.

28. The integrated assembly of claim 27 wherein the third stress-moderating region encompassing an entirety of said at least one of the routing regions.

29. The integrated assembly of claim 27 wherein the interconnect region is adjacent to a first side of the memory array region; wherein the memory array region has a second side proximate the first side; wherein the semiconductor die includes a peripheral region adjacent to the second side; wherein the stack of alternating insulative and conductive levels passes into the peripheral region; and further comprising a fourth stress-moderating region within the peripheral region and passing entirely through the stack.

30. The integrated assembly of claim 29 wherein the third and fourth stress-moderating regions are filled with the stress-moderating material.

31. The integrated assembly of claim 30 wherein the stress-moderating material comprises silicon and oxygen.

32. The integrated assembly of claim 30 wherein the stress-moderating material comprises silicon and carbon.

33. The integrated assembly of claim 30 wherein the stress-moderating material comprises silicon, carbon and nitrogen.

34. The integrated assembly of claim 25 wherein the second stress-moderating region is only partially filled with stress-moderating material.

35. The integrated assembly of claim 25 wherein the first and second stress-moderating regions together having an area which is at least about 5% of the total area of the memory array region.

36. An integrated assembly comprising:
  a semiconductor die having a first memory device tile adjacent to a second memory device tile; the first and second memory device tiles being spaced from one another by an inter-tile region; the first memory device tile having a first memory array region, and the second memory device tile having a second memory array region;
  a stack of alternating insulative and conductive levels extending across the first and second memory array regions; a segment of the stack being within the inter-tile region; the stack generating bending stresses on the die;
  a stress-moderating region extending through the segment of the stack and being filled with a stress-moderating material; and
  wherein the stress-moderating material comprises a ceramic composition.

37. The integrated assembly of claim 36 wherein the ceramic composition includes silicon and one or more of nitrogen, oxygen and carbon.

38. An integrated assembly comprising:
  a semiconductor die having a first memory device tile adjacent to a second memory device tile; the first and second memory device tiles being spaced from one another by an inter-tile region; the first memory device tile having a first memory array region, and the second memory device tile having a second memory array region;
  a stack of alternating insulative and conductive levels extending across the first and second memory array regions; a segment of the stack being within the inter-tile region; the stack generating bending stresses on the die;
  a stress-moderating region extending through the segment of the stack and being filled with a stress-moderating material;
  a first and second routing regions within the first and second memory array regions, respectively; wherein the stress-moderating region is a first stress-moderating region; and further comprising a second stress-moderating region encompassing at least a portion of the first routing region and a third stress-moderating region encompassing at least a portion of the second routing region;
  wherein stress-moderating material is a first stress-moderating material; and wherein the second and third stress-moderating regions are filled with a second stress-moderating material; and
  wherein the second stress-moderating material comprises a different composition relative to the first stress-moderating material.

39. An integrated assembly comprising:
  a semiconductor die having a first memory device tile adjacent to a second memory device tile; the first and second memory device tiles being spaced from one another by an inter-tile region; the first memory device tile having a first memory array region, and the second memory device tile having a second memory array region;
  a stack of alternating insulative and conductive levels extending across the first and second memory array regions; a segment of the stack being within the inter-tile region; the stack generating bending stresses on the die;
  a stress-moderating region extending through the segment of the stack and being filled with a stress-moderating material;
  the semiconductor die has a first interconnect region adjacent to the first memory array region and configured for establishing connections to the individual conductive levels of the stack;
  the semiconductor die has a second interconnect region adjacent to the second memory array region and configured for establishing connections to the individual conductive levels of the stack;
  the semiconductor die has a first intervening region between the first interconnect region and the first memory array region, and has first support structures extending upwardly through a full vertical dimension of the stack within the first intervening region;
  the semiconductor die has a second intervening region between the second interconnect region and the second memory array region, and has second support structures extending upwardly through a full vertical dimension of the stack within the second intervening region;
  the stress-moderating region is a first stress-moderating region;
  second and third stress-moderating regions are within the first and second intervening regions, respectively;
  wherein the stress-moderating material is a first stress-moderating material, and wherein the second and third stress-moderating regions are filled with a second stress-moderating material; and
  wherein the first and second support structures extend through the second stress-moderating material.

40. An integrated assembly comprising:
  a semiconductor die having a first memory device tile adjacent to a second memory device tile; the first and second memory device tiles being spaced from one another by an inter-tile region; the first memory device tile having a first memory array region, and the second memory device tile having a second memory array region;
a stack of alternating insulative and conductive levels extending across the first and second memory array regions; a segment of the stack being within the inter-tile region; the stack generating bending stresses on the die;
a stress-moderating region extending through the segment of the stack and being filled with a stress-moderating material;
the semiconductor die has a first interconnect region adjacent to the first memory array region and configured for establishing connections to the individual conductive levels of the stack;
the semiconductor die has a second interconnect region adjacent to the second memory array region and configured for establishing connections to the individual conductive levels of the stack;
the semiconductor die has a first intervening region between the first interconnect region and the first memory array region, and has first support structures extending upwardly through a full vertical dimension of the stack within the first intervening region;
the semiconductor die has a second intervening region between the second interconnect region and the second memory array region, and has second support structures extending upwardly through a full vertical dimension of the stack within the second intervening region;
the stress-moderating region is a first stress-moderating region;
second and third stress-moderating regions are within the first and second intervening regions, respectively;
wherein the stress-moderating material is a first stress-moderating material, and wherein the second and third stress-moderating regions are filled with a second stress-moderating material; and
wherein the second stress-moderating material comprises a different composition relative to the first stress-moderating material.

41. An integrated assembly comprising:
a semiconductor die having a memory array region;
a stack of alternating insulative and conductive levels extending across the memory array region;
an interconnect region adjacent to the memory array region and configured for establishing connections to the individual conductive levels of the stack;
an intervening region between the interconnect region and the memory array region;
a first stress-moderating region within the intervening region;
a second stress-moderating region within the interconnect region;
the first and second stress-moderating regions extending through the stack and being filled with stress-moderating material; the stress-moderating material comprising silicon and one or more of nitrogen, carbon and oxygen; and
wherein the second stress-moderating region is only partially filled with stress-moderating material.

42. An integrated assembly comprising:
a semiconductor die having a memory array region;
a stack of alternating insulative and conductive levels extending across the memory array region;
an interconnect region adjacent to the memory array region and configured for establishing connections to the individual conductive levels of the stack;
an intervening region between the interconnect region and the memory array region;
a first stress-moderating region within the intervening region;
a second stress-moderating region within the interconnect region;
the first and second stress-moderating regions extending through the stack and being filled with stress-moderating material; the stress-moderating material comprising silicon and one or more of nitrogen, carbon and oxygen; and
wherein the first and second stress-moderating regions together having an area which is at least about 5% of the total area of the memory array region.

* * * * *